United States Patent
Wu et al.

(10) Patent No.: US 12,188,686 B2
(45) Date of Patent: Jan. 7, 2025

(54) AIR CURTAIN DEVICE AND WORKPIECE PROCESSING TOOL

(71) Applicant: Taiwan Semiconductor Manufacturing Co., Ltd., Hsinchu (TW)

(72) Inventors: Chia-Wei Wu, Hsinchu (TW); Hao Yang, Hsinchu (TW); Hsiao-Chieh Chou, Hsinchu (TW); Chun-Hung Chao, Hsinchu (TW); Jao Sheng Huang, Hsinchu (TW); Neng-Jye Yang, Hsinchu (TW); Kuo-Bin Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 328 days.

(21) Appl. No.: 17/733,657

(22) Filed: Apr. 29, 2022

(65) Prior Publication Data

US 2023/0349574 A1    Nov. 2, 2023

(51) Int. Cl.
*F24F 9/00* (2006.01)
*H01L 21/67* (2006.01)
*H01L 21/687* (2006.01)

(52) U.S. Cl.
CPC .......... *F24F 9/00* (2013.01); *H01L 21/67196* (2013.01); *H01L 21/68707* (2013.01)

(58) Field of Classification Search
CPC ........ F24F 9/00; F24F 3/163; F24F 2009/005; F24F 2009/007; H01L 21/68707; H01L 21/67017; H01L 21/67393; H01L 21/67196
See application file for complete search history.

(56) References Cited

U.S. PATENT DOCUMENTS

| | | | |
|---|---|---|---|
| 9,010,384 B2 * | 4/2015 | Yoshimura | H01L 21/67772 414/935 |
| 10,593,580 B2 * | 3/2020 | Woo | H01L 21/67196 |
| 10,998,212 B2 * | 5/2021 | Lin | H01L 21/67769 |
| 2015/0024671 A1 * | 1/2015 | Taniyama | H01L 21/67772 454/193 |
| 2020/0073258 A1 * | 3/2020 | Chiu | G03F 7/70725 |

* cited by examiner

*Primary Examiner* — Glenn F Myers
(74) *Attorney, Agent, or Firm* — Seed IP Law Group

(57) ABSTRACT

The present disclosure is at least directed to utilizing air curtain devices to form air curtains to separate and isolate areas in which respective workpieces are stored from a transfer compartment within a workpiece processing apparatus. The transfer compartment of the workpiece processing apparatus includes a robot configured to transfer or transport ones of the workpieces to and from these respective storage areas through the transfer compartment and to and from a tool compartment. A tool is present in the tool compartment for processing and refining the respective workpieces. Clean dry air (CDA) may be circulated through the respective storage areas. The air curtains formed by the air curtain devices and the circulation of CDA through the respective storage areas reduces the likelihood of the generation of defects, damages, and degradation of the workpieces when present within the workpiece processing apparatus.

20 Claims, 11 Drawing Sheets

AIR CURTAIN DEVICE AND WORKPIECE PROCESSING TOOL

BACKGROUND

Generally, in the manufacture of semiconductor devices, robots are often utilized to transfer a workpiece, such as a silicon wafer, between various locations within a processing apparatus or between various processing apparatuses that are separate and distinct from each other. For example, the robot may transfer wafers between various locations or positions within the processing apparatus while utilizing a tool within the processing apparatus to refine or process the workpiece during stages of manufacturing various semiconductor products or devices. The workpiece may be transferred by a transfer blade of the robot between these various locations or positions within the processing apparatus.

Some of the locations or positions of the workpieces within the processing apparatus may include storage areas or buffer zones that temporarily hold the workpieces when the tool in the processing apparatus is already in use. For example, a respective workpiece may be within one of these temporary holding zones while awaiting to be processed or refined by the tool within the processing apparatus. Workpieces stored within these storage areas or buffer zones may be transferred to and from various locations within the processing apparatus or transferred to and from other containers (e.g., front opening universal pod or front opening unified pod (foup)) by the transfer robot that is present within the processing apparatus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
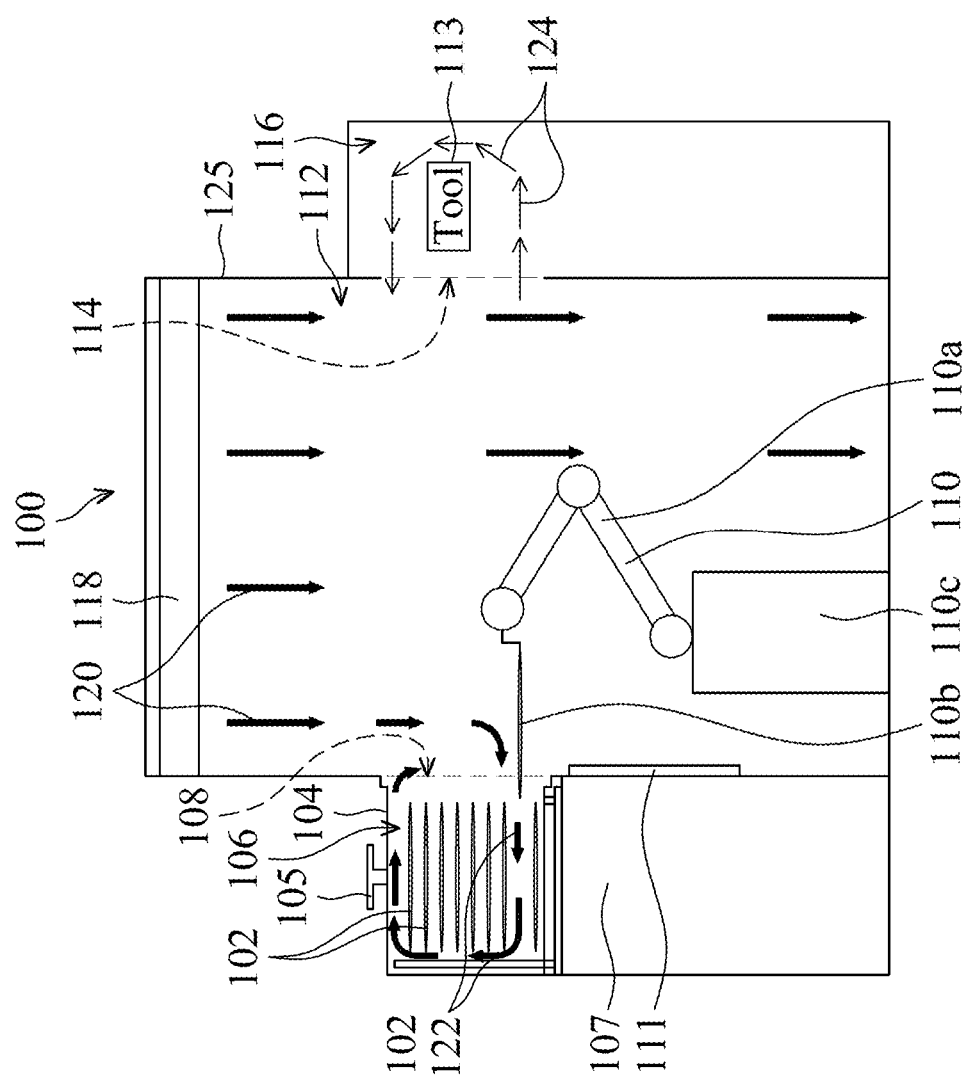
FIG. 1A illustrates a schematic side view of an example of a workpiece processing apparatus.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is directed to a workpiece processing apparatus or device 100 that may be utilized to process or refine one or more workpieces 102. For example, the workpieces 102 may be wafers, substrates, silicon wafers, silicon substrates, or some other similar or like type of workpiece that may be processed or refined by the workpiece processing apparatus 100.

The one or more workpieces 102 are present within a container 104, and the one or more workpieces 102 are in a stacked configuration based on the orientation of the container 104 as shown in FIG. 1A. The container 104 may be a cassette, a front opening universal pod or front opening unified pod (foup), or some other similar or like type of container configured to contain one or more of the workpieces 102, which may be one or more wafers. The container 104 further includes a lift structure 105 and a workpiece chamber 106.

The workpieces 102 are contained and stored within the workpiece chamber 106. An opening 108 of the container 104 is in fluid communication with the workpiece chamber 106. A robot 110 within a transfer compartment 112 of the workpiece processing apparatus 100 may access the one or more workpieces 102 within the workpiece chamber 106 of the container 104 through the opening 108. As shown in FIG. 1A, the container 104 is present at and on a load port structure or unit 107 of the workpiece processing apparatus 100 such that the opening 108 of the container 104 is in fluid communication with the transfer compartment 112. The container 104 may have been positioned and placed on the load port structure 107 by utilizing a carrier and track system (not shown) that mechanically engages and cooperates with the lift structure 105. For example, the lift structure 105 may be a handle that an end effector of the carrier and track system (not shown) may readily mechanically engage or cooperate. Once the end effector of the carrier and track system (not shown) mechanically engages with the lift structure 105, the carrier and track system (not shown) may transport the container 104 to and from the workpiece processing apparatus 100 within a workpiece or semiconductor fabrication plant (FAB). The workpiece processing apparatus 100 may be one of several processing tools, apparatuses, or devices within the FAB of which the carrier and track system (not shown) transports several of the containers 104 to and from while manufacturing semiconductor products or devices within the FAB.

The robot 110 includes a robotic arm 110a with a transfer blade 110b at an end of the robotic arm 110a. The transfer blade 110b is configured to pick up and transfer one of the workpieces 102 through the transfer compartment 112. For example, the transfer blade 110b picks up and supports one of the workpieces 102 by moving the transfer blade 110b into the workpiece chamber 106 through the opening 108, aligning the transfer blade 110b below one of the workpieces 102, and lifting up on a lower surface of one of the workpieces 102 with the transfer blade 110b.

After lifting up on the respective workpiece 102 with the transfer blade 110b, the robot 110 then removes the respective workpiece 102 from the workpiece chamber 106 with the transfer blade 110b. For example, the transfer blade 110b exits the workpiece chamber 106 by passing through the opening 108 while also lifting and supporting the respective workpiece 102. The robotic arm 110a of the robot is then articulated and actuated accordingly to move the transfer blade 110b lifting and supporting the workpiece 102 through an opening 114 into a tool compartment 116 of the workpiece processing apparatus 100. The respective workpiece 102 is then placed or deposited within the tool compartment 116 to be processed or refined by a tool 113 within the tool compartment 116. The tool 113 may be an EUV lithography tool (e.g., laser and EUV stencil combination), an etching tool, or some other similar or like type of workpiece processing tool that is configured to process and refine the respective workpiece 102 present within the tool compartment 116 utilizing the tool 113.

As shown in FIG. 1A, the robot 110 further includes a base 110c from which the robotic arm 110a extends. While not shown in FIG. 1A, the base 110c may include a motor and other electrical and mechanical components (e.g., gears, power source, memory, controller, etc.) to articulate and actuate the robotic arm 110a to transfer or transport the workpieces 102 through the transfer compartment 112 when the workpiece processing apparatus 100 is in operation.

The workpiece processing apparatus 100 further includes a filter fan unit (FFU) 118 at an upper end of the workpiece processing apparatus 100. The FFU 118 is in fluid communication with the transfer compartment 112 and is utilized to circulate air through the transfer compartment 112. The FFU 118 is at a top or upper end of the transfer compartment 112. As shown in FIG. 1A, the flow of air through the transfer compartment 112 is represented by arrows 120 and is directed downwards through the transfer compartment 112 based on the orientation of the workpiece processing apparatus 100 as shown in FIG. 1A. While circulating the air through the transfer compartment 112, the FFU 118 may filter and process the air to remove contaminants or control other environmental qualities or quantities within the transfer compartment 112.

As the air flows through the transfer compartment 112, some of the air may enter the opening 108 and flow into the workpiece chamber 106. The flowing of the air into the workpiece chamber 106 through the opening 108 is represented by arrows 122. The flow of air from the transfer compartment 112 into the workpiece chamber 106 may damage the workpieces 102, may degrade the workpieces 102, or may cause defects on the workpieces 102.

For example, these defects, damage, or degradation may be due to contaminants entering and contacting the workpieces 102, which may result in outgassing occurring on the workpieces 102. This outgassing may damage or degrade the quality of the workpieces 102 such that the workpieces 102 are no longer of sufficient quality to be further processed or refined when manufacturing a semiconductor product within the FAB. In other words, the drop in quality of the workpieces causes semiconductor products or devices manufactured with the reduced quality workpieces to not satisfy preferred or selected tolerances.

Similarly, a relative humidity within the workpiece chamber 106 may increase due to the air entering the opening 108 from the transfer compartment 112. This increase in relative humidity (e.g., increase in moisture in the air within the workpiece chamber 106) may degrade or damage the workpieces 102 such that the workpieces 102 are no longer of sufficient quality as discussed above. For example, the increase in the moisture in the air may corrode sensitive features present on or in the workpieces. These sensitive features may be thin layers of conductive material that may readily corrode when exposed to too much humidity or moisture.

As the air flows through the transfer compartment 112, some of the air may enter the opening 114 into the tool chamber 116. The flowing of the air into the tool chamber 116 through the opening 114 is represented by arrows 124. The flow of air from the transfer compartment 112 into the tool compartment 116 may damage the workpiece 102 within the tool compartment 116, degrade the workpiece 102 within the tool compartment 116, or cause defects on the workpiece 102 within the tool compartment 116. These defects may be due to contaminants entering and contacting the workpiece 102 when being processed or refined by the tool 113 in the tool compartment 116, which may result in an error occurring while processing or refining the workpiece 102 with the tool 113.

Similarly, a relative humidity within the tool compartment 116 may increase due to the air entering the opening 114 from the transfer compartment 112. This increase in relative humidity (e.g., increase in moisture in the air within the tool compartment 116) may degrade or damage the workpieces 102 such that the workpieces 102 are no longer of sufficient quality as discussed above. For example the increase in the moisture in the air may corrode sensitive features present on or in the workpieces. These sensitive features may be thin layers of conductive material that may readily corrode when exposed to too much humidity or moisture.

The workpiece processing apparatus 100 may include a housing 125 that contains the transfer compartment 112 and the tool compartment 116. The workpiece processing apparatus 100 may include the robot 110, the transfer compartment 112 in which the robot 110 is present, the tool 113, the tool compartment 116 in which the tool 113 is present, and the FFU 118 at the upper end of the workpiece processing apparatus 100.

A load port structure or unit 107 of the workpiece processing apparatus 100 is present on the left-hand side of the workpiece processing apparatus 100 based on the orientation as shown in FIG. 1A. The container 104, which contains the workpieces 102, is removable from the load port structure 107 of the workpiece processing apparatus 100 by the carrier and track system (not shown) as discussed earlier herein. For example, processed or refined workpieces may be transferred from the workpiece processing apparatus 100 after the workpieces 102 have been processed or refined by the tool 113 and repositioned within the container 104 utilizing the robot 110. Similarly, new unrefined or unprocessed workpieces within a new container 104 may be transported to the workpiece processing apparatus 100 and placed on the load port structure 107 such that the unrefined or unprocessed workpieces 102 may be refined or processed by the tool 113.

The workpiece processing apparatus 100 may further include an opening and closing interface mechanism 111 that is configured to remove lid (not shown) from the container 104 and couple the lid (not shown) to the container 104. The opening and closing interface mechanism 111 is configured to move from a closed position to an opened position and vice versa. For example, when the container 104 is present on the load port structure 107, the opening and closing interface mechanism 111 may remove the lid (not shown) from the container 104 and move from the closed position to the opened position. When the container 104 is to be removed from the load port structure 107 by the carrier and track system (not shown), the opening and closing interface mechanism 111 moves from the opened position to the closed position and reattaches the lid (not shown) to the container 104 closing off the opening 108 and enclosing the workpieces 102 within the container 104.

Figure 1B:
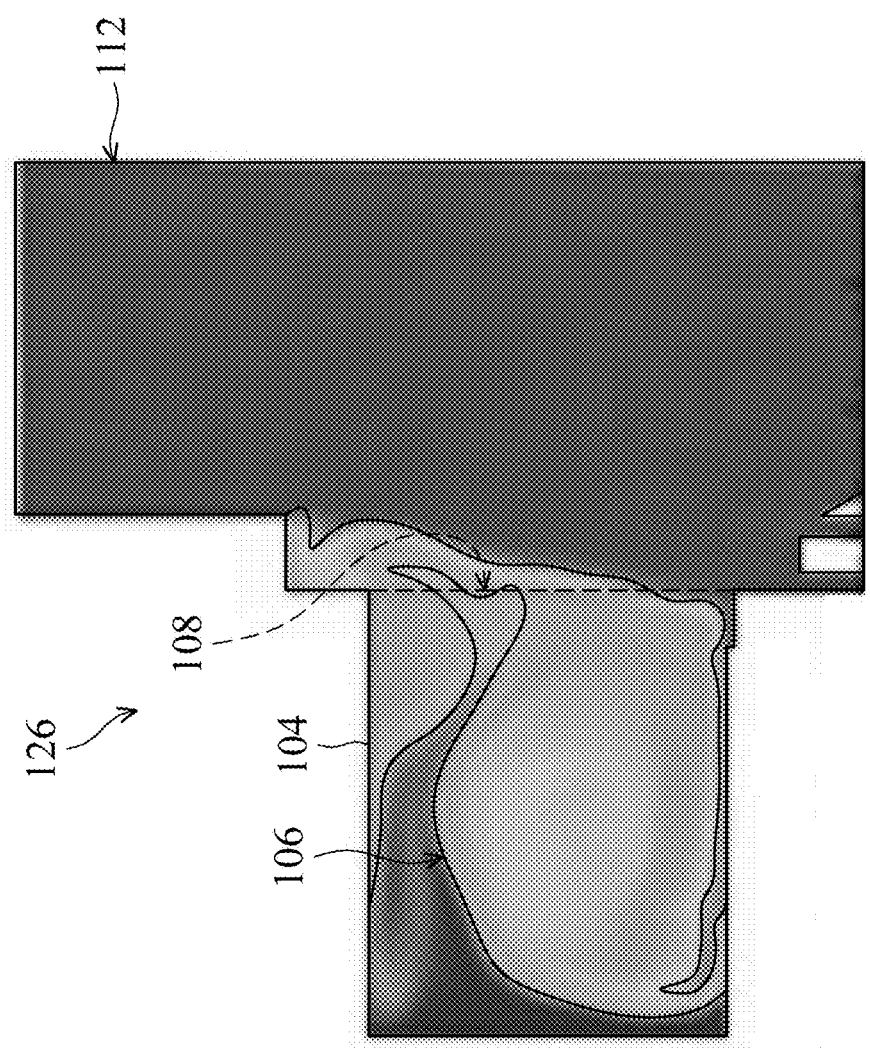
FIG. 1B illustrates an example of a flow map diagram with respect to the example of the workpiece processing apparatus as illustrated in FIG. 1A.

FIG. 1B is a flow map diagram 126 that shows details with respect to the air flow circulating within the workpiece chamber 106 that enters the workpiece chamber 106 through the opening 108 due to the downward flow of the air through the transfer compartment 112 (e.g., represented by the arrows 120 as shown in FIG. 1A). In other words, the air flowing downwards through the transfer compartment 112 readily enters the container 104. As discussed above, this type of air flow may increase the likelihood of and result in damage, defects, or degradation to the workpieces 102 present within workpiece chamber 106.

This increase in the likelihood of damage, defects, degradation, or processing errors due to the air flow from the transfer compartment 112 into the workpiece chamber 106 (represented by the arrows 122) or the tool compartment 116 (represented by the arrows 124) may result in increased costs and reduced yields when manufacturing a semiconductor product within the FAB. For example, as there is an increase in defective semiconductor products or devices that are manufactured within the FAB that do not satisfy selected or preferred tolerances, these defective semiconductor products and devices cannot be provided to customers. Accordingly, embodiments of processing tools utilizing air curtain devices at selected locations of the present disclosure may be utilized to reduce the likelihood of damage, defects, degradation, or processing errors due to the air flow from the transfer compartment 112 into the workpiece chamber 106 or the tool compartment 116, which will become readily apparent in view of the discussion within the present disclosure.

Figure 2A:
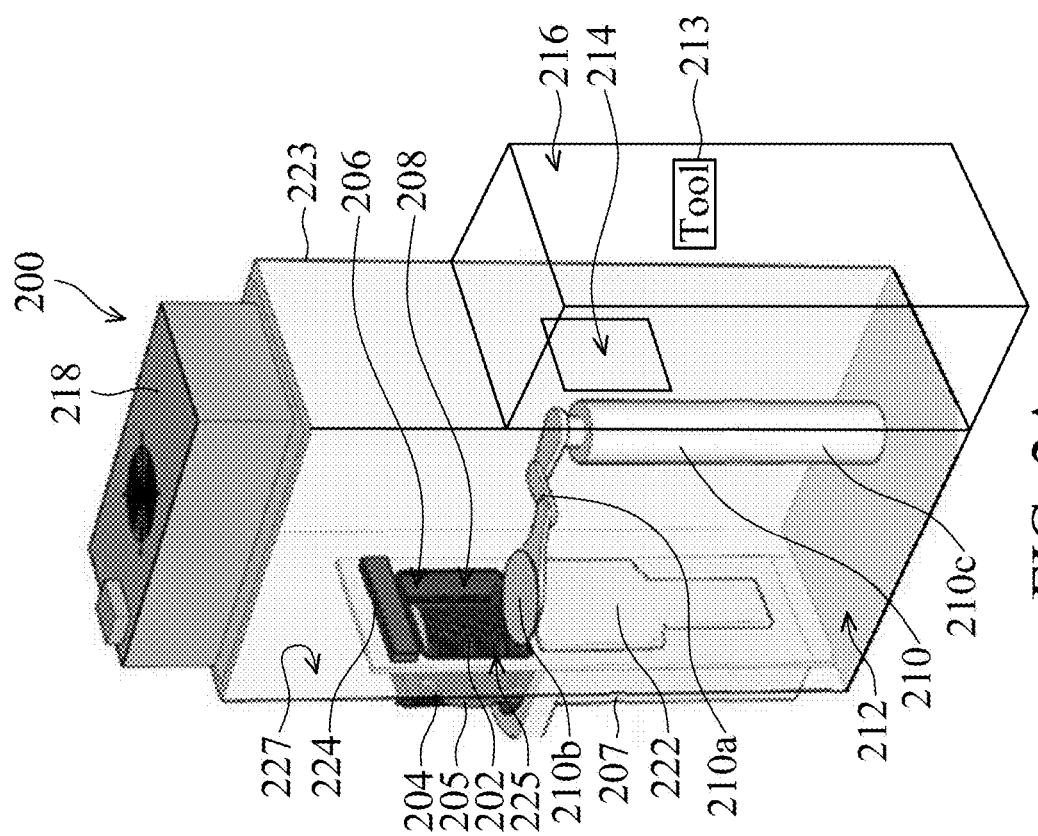
FIG. 2A illustrates a perspective view of an example of a workpiece processing apparatus, in accordance with some embodiments of the present disclosure.

FIG. 2A illustrates a perspective view of a workpiece processing tool, device, or apparatus 200, in accordance with some embodiments of the present disclosure. The workpiece processing apparatus 200 is configured to be utilized to process or refine one or more workpieces 202. For example, the workpieces 202 may be wafers, substrates, silicon wafers, silicon substrates, or some other similar or like type of workpiece that may be processed or refined by the workpiece processing apparatus 200.

The one or more workpieces 202 are present within a container 204, and the one or more workpieces 202 are in a stacked configuration based on the orientation of the container 204 as shown in FIG. 2A. The container 204 may be a cassette, a front opening universal pod or front opening unified pod (foup), or some other similar or like type of container configured to contain one or more of the workpieces 202. The container 204 further includes a lift structure 205 and a workpiece chamber 206. The lift structure 205 may be a handle that is configured to mechanically engage and cooperate with an end effector of a carrier and track system (not shown) to transport the container 204 to and from the workpiece processing apparatus 200. The carrier and track system (not shown) may be the same as or similar to the carrier and track system (not shown) as the one discussed earlier with respect to the workpiece processing apparatus 100 as shown in FIG. 1A. The workpiece chamber 206 may be referred to as a workpiece storage chamber, a workpiece storage cavity, a workpiece storage compartment, or some other similar or like type of reference to the workpiece chamber 206.

The workpieces 202 are contained and stored within the workpiece chamber 206 and an opening 208 of the container 204 is in fluid communication with the workpiece chamber 206. A robot 210 within a transfer compartment 212 of the workpiece processing apparatus 200 may access the one or more workpieces 202 within the workpiece chamber 206 of the container 204 through the opening 208. As shown in FIG. 2A, the container 204 is present at and on a load port structure or unit 207 of the workpiece processing apparatus 200 such that the opening 208 of the container is in fluid communication with the transfer compartment 212. The container 204 may have been positioned and placed on the load port structure 207 by utilizing the carrier and track system (not shown). The workpiece processing apparatus 200 may be one of several processing tools, apparatuses, or devices within the FAB.

The robot 210 includes a robotic arm 210a with a transfer blade 210b at an end of the robotic arm 210a. The transfer blade 210b is configured to pick up and transfer or transport one of the workpieces 202 through the transfer compartment 212. For example, the transfer blade 210b picks up and supports one of the workpieces 202 by moving the transfer blade 210b into the workpiece chamber 206 through the opening 208, aligning the transfer blade 210b below one of the workpieces 202, and lifting up on a lower surface of one of the workpieces 202 with the transfer blade 210b.

After lifting up on the respective workpiece 202 with the transfer blade 210b, the robot 210 then removes the respective workpiece 202 from the workpiece chamber 206 with the transfer blade 210b. For example, the transfer blade 210b exits the workpiece chamber 106 by passing through the opening 208 while also lifting and supporting the respective workpiece 202. The robotic arm 210a of the robot 210 is then articulated and actuated accordingly to move the transfer blade 210b lifting and supporting the workpiece 202 through an opening 214 into a tool compartment 216 of the workpiece processing apparatus 200. The respective workpiece 202 is then placed or deposited within the tool compartment 216 to be processed or refined by a tool 213 within the tool compartment 216. The tool 213 may be an EUV lithography tool (e.g., laser and EUV stencil combination), an etching tool (e.g., dry etching, wet etching, photolithography etching, etc.), a vapor deposition tool (e.g., chemical vapor deposition (CVD), physical vapor deposition (PVD), etc.), a wet clean tool, or some other similar or like type of workpiece processing tool that is configured to process and refine the respective workpiece 202 present within the tool compartment 216 utilizing the tool 213.

As shown in FIG. 2A, the robot 210 further includes a base 210c from which the robotic arm 210a extends. While not shown in FIG. 2A, the base 210c may include a motor and other electrical and mechanical components (e.g., gears, power source, memory, controller, etc.) to articulate and actuate the robotic arm 210a to transfer or transport the workpieces 202 through the transfer compartment 212 when the workpiece processing apparatus 200 is in operation.

The workpiece processing apparatus 200 further includes a filter fan unit (FFU) 218 at an upper end of the workpiece processing apparatus 200. The FFU 218 is in fluid communication with the transfer compartment 212 and is utilized to circulate air through the transfer compartment 212. The FFU 218 is at a top or upper end of the transfer compartment 212. As shown in FIG. 1A, the flow of air through the transfer compartment 212 is represented by arrows 220 in FIG. 2B and is directed downwards through the transfer compartment 212 based on the orientation of the workpiece processing apparatus 200 as shown in FIG. 2A. While circulating the air through the transfer compartment 212, the FFU 218 may filter and process the air to remove contaminants or control other environmental qualities or quantities within the transfer compartment 212.

The workpiece processing apparatus 200 further includes an opening and closing interface mechanism 222, which may be referred to as a front opening and closing interface mechanism 222, that is configured to remove a lid 209 (see FIG. 2B of the present disclosure) from the container 204 (e.g., a foup). The opening and closing interface mechanism 222 is configured to remove the lid 209 (see FIG. 2B in which the lid 209 is held by the opening and closing interface mechanism 222 when the lid 209 is removed from the container 204) of the container 204 after the container 204 is placed on the load port structure 207. The lid 209 covers the opening 208 and encloses the one or more workpieces 202 within the workpiece chamber 206 of the container 204 when transporting the container 204 with the carrier and track system (not shown). In other words, when an end effector of the carrier and track system (not shown) mechanically engages and cooperates with the lifting structure 205 to transport the container 204 through the FAB, the lid 209 is coupled to the container 204 enclosing the workpieces 202 within the workpiece chamber 206 such the workpieces 202 do not fall out of the container 204.

Before the container 204 is placed on the load port structure 207, the opening and closing interface mechanism 222 is in a closed position in which the opening and closing interface mechanism 222 closes off the transfer compartment 212 from an external environment outside a housing 223 of the workpiece processing apparatus 200. The opening and closing interface mechanism 222 closes off a load port opening 225 in a sidewall 227 of the workpiece processing apparatus 200. In other words, the opening and closing interface mechanism 222 acts as a door closing off the opening 225 when in the closed position. It will be readily appreciated that the opening and closing interface mechanism 111, as discussed above with respect to the workpiece processing apparatus 100 as shown in FIG. 1A, functions in the same or similar manner as the opening and closing interface mechanism 222 as discussed herein with respect to FIGS. 2A and 2B. The opening 225 may be referred to as a load port opening or some other similar or like type reference to the opening 225.

After the container 204 is placed on the load port structure 207, the opening and closing interface mechanism 222 mechanically cooperates and engages with the lid 209 of the container 204 and removes the lid 209 from the container 204 to expose the opening 208 and the workpiece chamber 206 of the workpiece container 204. The removal of the lid 209 may occur either slightly before or relatively at the same time as the opening and closing interface mechanism 222 moves from the closed position to the opened position. The opening and closing interface mechanism 222 is in the opened position as shown in FIG. 2A.

When the container 204 is to be moved or transferred away from the workpiece processing apparatus 200, the opening and closing interface mechanism 222 is moved from the opened position to the closed position, and the opening and closing interface mechanism 222 attaches the lid 209 to the container 204 and closes off the opening 208 and the workpiece chamber 206 of the container 204 with the lid 209. The container 204 is then removed from the load port structure 207 by the carrier and track system, which mechanically engages and cooperates with the lifting structure 205 of the container 204.

When the container 204 is on the load port structure 207, sides of the container form an air tight seal with sides of the workpiece processing apparatus 200 that delimit the opening 225 in the sidewall 227 of the workpiece processing apparatus 200. When the container is not present on the load port structure 207, the opening and closing interface mechanism 222 is in the closed position and covers the opening 225 and forms an air tight seal with the sides of the sidewall 227 that delimit the opening 225 in the sidewall 227 of the workpiece processing apparatus 200.

Figure 2B:
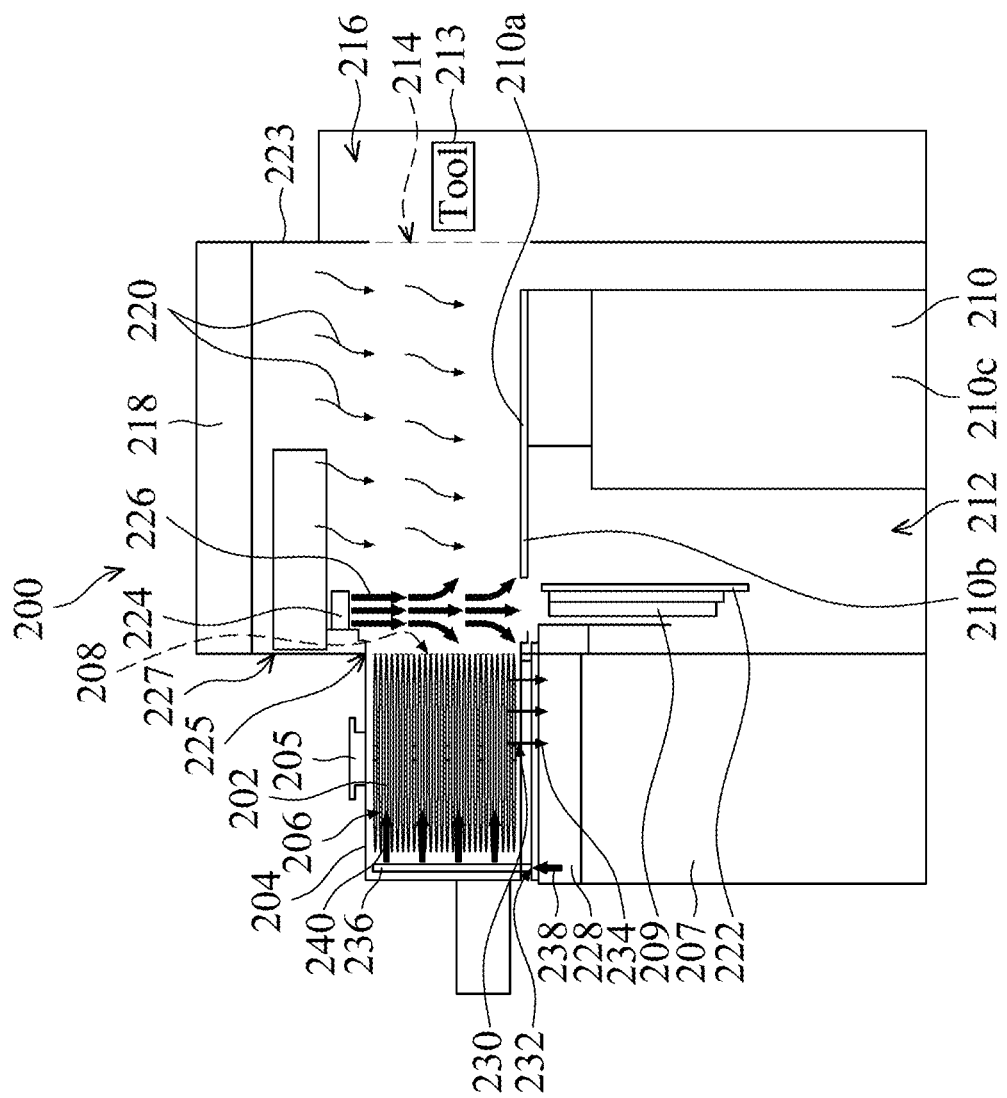
FIG. 2B illustrates a schematic side view of the example of the work processing apparatus as shown in FIG. 2A, in accordance with some embodiments of the present disclosure.

A first air curtain device 224 is adjacent to an upper end of the opening 208 of the container 204, and is adjacent to an upper end of the opening 225 in the sidewall 227. As shown in FIG. 2B, the first air curtain device 224 forms a first air curtain 226 that is represented by arrows 226. These arrows 226 together may be referred to as the first air curtain 226 in the discussion herein.

The first air curtain device 224 may form the first air curtain 226 such that the air curtain 226 is laminar, and, accordingly, is relatively uniform and consistent such that the air curtain 226 is laminar. For example, the first air curtain 226 may have a fluid flow with a Reynolds number less than or equal to about 2,000 such that the first air curtain 226 is laminar and is not turbulent such that the workpiece chamber 206 of the container 204 is separated and isolated from the transfer compartment 212 in a controlled manner. This laminar fluid flow of the first air curtain 226 may reduce the likelihood of the generation of defects, damages, or degradation of the workpieces 202 stored within the workpiece chamber 206 of the container 204.

The first air curtain 226 is directed downwards and overlaps the opening 208 of the container 204. The first air curtain 226 may overlap the opening 225 in the sidewall 227 of the housing 223 of the workpiece processing apparatus 200 as well. The first air curtain 226 may entirely and completely overlap the opening 208 such that the air flowing (e.g., arrows 220) through the transfer compartment 212 may not readily enter the workpiece chamber 206 of the container 204 containing the workpieces 202 through the opening 208. In other words, the first air curtain 226 acts as a boundary or a wall of air that prevents air flowing downward through the transfer compartment 212 from entering the opening 208 into the workpiece chamber 206 of the container 204.

The first air curtain device 224 may receive clean dry air (CDA) from a CDA source (not shown) and pass the CDA through a plurality of nozzles 254 (see FIG. 3 that illustrates details of the first air curtain device 224, in accordance with some embodiments of the present disclosure) to form the first air curtain 226. The CDA output by the first air curtain device 224 may have a first relative humidity less than a second relative humidity of the air (e.g., arrows 220) being circulated through the transfer compartment 212 by the FFU 218. For example, the first relative humidity may be about 10% and the second relative humidity may be about 40%. This reduces the likelihood of the workpieces 202 within the workpiece chamber 206 of the container 204 from being exposed to the air flowing (e.g., arrows 220) through the transfer compartment 212 with the second relative humidity for prolonged periods of time. For example, the workpieces 202 may be present in the workpiece chamber 206 for a first period of time before being transferred to the tool compartment 216 by the robot 210 through the transfer compartment 212, and the workpiece 202 is transferred across the transfer compartment 212 by the robot over a second period of time, which is generally less than the first period of time.

By reducing this likelihood of exposing the workpieces 202 to the air (e.g., arrows 220) with the second relative humidity, the likelihood of the generation of defects in the workpieces 202 is reduced as there is less likelihood of outgassing occurring due to contaminants present on or introduced to the workpieces 202 by the air flowing from the transfer compartment 212 into the workpiece chamber 206 of the container 204. In other words, to reiterate, the first air curtain 226 acts as a boundary or a wall of air that stops and prevents air flowing downwards through the transfer compartment 212 from entering the opening 208 into the workpiece chamber 206 of the container 204. This prevention of air flow from the transfer compartment 212 into the workpiece chamber 206 reduces the likelihood of the generation of defects, damage, or degradation of the workpieces 202 within the workpiece chamber 206.

Reducing exposure of the workpieces 202 to the second relative humidity, which is greater than the first relative humidity reduces the likelihood of the generation of defects, damages, or degradation of the workpieces 202. For example, exposing the workpieces 202 to the air with the second relative humidity may degrade or damage the workpieces 202 more quickly than when exposing the workpieces 202 to the air with the first relative humidity, which again is less than the second relative humidity. For example, the second relative humidity with the greater amount of the moisture in the air may corrode sensitive features present on or in the workpieces 202 that the first relative humidity may not. These sensitive features may be thin layers of conductive material that may readily corrode when exposed to too much humidity or moisture.

As shown in FIG. 2B, the first air curtain 226 is directed downwards towards the opening and closing interface mechanism 222 that is holding the lid 209 of the container 204. The opening and closing interface mechanism is holding the lid 209 such that the workpieces 202 are accessible to the transfer blade 210*b* of the robot 210. In some embodiments, the transfer blade 210*b* may pass through the air curtain 226 output by the first air curtain device 224 to reach the workpieces 202 when transferring the workpieces 202 from the workpiece chamber 206 to the tool compartment 216. Alternatively, in some embodiments, the first air curtain device 224 may be turned off such that the first air curtain 226 is not present when the transfer blade 210*b* enters the opening 208 to pick up one of the workpieces 202 to transfer or transport the respective workpiece 202 to the tool compartment 216. Once the transfer blade 210*b* exits the opening 208, the first air curtain device 224 may be turned on to again form the first air curtain 226.

As shown in FIG. 2B, an air purge or diffuser device 228 is accessible at an upper end of the load port structure 207. While not shown, functional components of the air purge device 228 may be present within the load port structure 207, which are not readily shown in detail for brevity and simplicity of the present disclosure. For example, the air purge device 228 may include an air filter, an air treatment component, an air treatment system, a CDA source, or some other similar or like types of components that allow for the air purge device 228 to purge, clean, or process air within the workpiece chamber 206 of the container 204. In other words, the air purge device 228 is configured to control environmental quantities and qualities within the workpiece chamber 206 of the container 204 to reduce the likelihood of the generation of defects, damages, or degradation of the workpieces 202.

The air purge device 228 is in fluid communication with the workpiece chamber 206 of the container 204 when the container 204 is present on the load port structure 207. The air purge device 228 includes an inlet 230 in fluid communication with the workpiece chamber 206 and an outlet 232 in fluid communication with a fluid distribution structure 236. The inlet 230 is further away from the opening 208 of the container 204 than the outlet 232. The air within the workpiece chamber 206 flows out of the workpiece chamber 206 into the air purge device 228 through the inlet 230, and this flow of air into the inlet is represented by arrows 234 as shown in FIG. 2B. In some embodiments, after the air from the workpiece chamber 206 enters the air purge device 228 through the inlet 230, the air may leave the load port structure 207 and be communicated to an air filtration and treatment device that cleans, treats, and converts the air into CDA by removing contaminants and humidity from the air. Alternatively, in some embodiments, an air filtration and treatment system may be present within the load port structure 207 itself instead of being separate and distinct from the workpiece processing apparatus 200.

Clean dry air (CDA) provided through the outlet 232 of the air purge device 228 enters the fluid distribution structure 236, which is within the workpiece chamber 206 of the container 204. The fluid distribution structure 236 then distributes the CDA exiting the air purge device 228 through the outlet 232 into the workpiece chamber 206 of the container 204 in a relatively even distribution. The CDA passing through the outlet 232 is represented by arrow 238 as shown in FIG. 2B. In some embodiments, the CDA provided through the air purge device 228 to the fluid distribution structure 236 may be provided by a separate CDA source. Alternatively, in some embodiments, the CDA may be air that entered the air purge device 228 through the inlet 230 from the workpiece chamber 206 and was previously processed by air filter and treatment components either external to the workpiece processing apparatus 200 or within the load port structure 207 itself. The air purge device 228 may be referred to as an air purge module, a fluid purge module, or some other similar or like type of reference to the air purge device 228.

The fluid distribution structure 236 may be a pipe or a plurality of pipes that include nozzles such that the CDA passes through these nozzles into the workpiece chamber 206 of the container 204 in an evenly distributed manner (e.g., even distribution of CDA from the bottom end to the top end of the container 204 based on the orientation as shown in FIG. 2B). The CDA flowing into the workpiece chamber 206 through the fluid distribution structure 236 is represented by arrows 240.

The air and the CDA that passes through the workpiece chamber 206, the inlet 230, the outlet 232, and the fluid distribution structure 236 remains separated from the air flow 220 within the transfer compartment 212. The first air curtain 226 allows the air and CDA to circulate through these components into and out of the workpiece chamber 206 without being exposed to the air flow 220 within the transfer compartment 212. In other words, the first air curtain 226 acts as a boundary or wall of air that separates the flow of air in the workpiece chamber 206 from the flow of air within the transfer compartment 212. This separation of air flow in the workpiece chamber 206 and the transfer compartment 212 reduces the likelihood of the workpieces 202 within the workpiece chamber 206 of the container 204 being exposed to the air flowing through the transfer compartment 212. This separation of the environment within the workpiece chamber 206 and the environment in the transfer compartment 216 allows for ease in controlling the environment within the workpiece chamber 206, which in turn reduces the likelihood of the generation of defects, damage, or degradation of the workpieces 202 within the workpiece chamber 206.

In view of the above discussion, the air and the CDA is circulated in a clockwise direction based on the orientation of the container 204 on the load port structure 207 in view of the respective arrows 234, 238, 240 representing the flow of air and the CDA through the workpiece chamber 206 and the air purge device 228. However, it will be readily appreciated that the direction of air flow through the workpiece chamber 206 and the air purge device 228 may be adjusted simply based on the reorientation of the container 204.

When the tool 213 is a wet clean tool or some similar or like type of wet tool that performs a wet process, controlling environmental quantities and qualities (e.g., relative humidity) within the workpiece chamber 206 of the container 204, the transfer compartment 212, and the tool compartment 216 may be even more challenging relative to when the tool 213 is not a wet clean tool or some other similar or like type of wet tool. However, while this may be more challenging, providing the air curtain device 224 that forms the air curtain 226 alone allows for the environment quantities and qualities within the workpiece chamber 206 to remain separated and isolated from those in the transfer compartment 212 and the tool compartment 216. When the air curtain device 224 is present and is utilized in combination with the air purge device 228, which circulates CDA through the environment of the workpiece chamber 206, the environmental quantities or qualities (e.g., relative humidity) within the container 204 may be further controlled to reduce the likelihood of the generation of defects, damages, or degradation of the workpieces 202 within workpiece chamber 206 of the container 204.

Figure 2C:
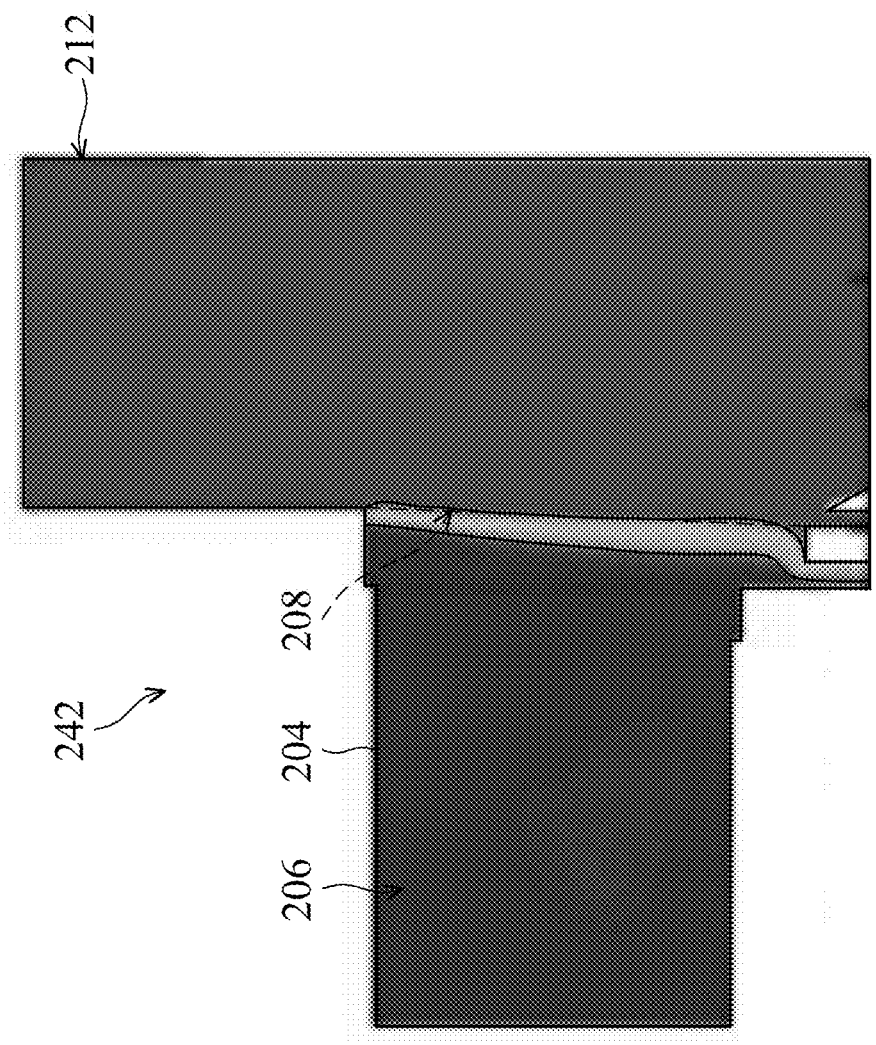
FIG. 2C illustrates a flow map diagram with respect to the example of the workpiece processing apparatus as illustrated in FIGS. 2A and 2B, in accordance with some embodiments of the present disclosure.

FIG. 2C is a flow map diagram 242 that shows details with respect to the air flow circulating within the workpiece chamber 206 that is separated from the air flow 220 within the transfer compartment 212 by the first air curtain 226 as shown in FIG. 2B. Unlike in the flow map diagram 126 as shown in FIG. 1B in which no air curtain is present between the transfer compartment 112 and the workpiece chamber 106 of the container 104, in the flow map 242, the first air curtain device 224 forms the first air curtain 226 and separates the air flow within the workpiece chamber 206 from the air flow within the transfer compartment 212.

As shown in the flow map 242, the air flow within the workpiece chamber 206 remains separated, blocked, and isolated from the air flow within the transfer compartment 212, unlike in the flow map 126 in which the air flow within the workpiece chamber 106 does not remain separate from the air flow within the transfer compartment 112 as there is no air curtain device, and, therefore, no air curtain present. The air flow within the workpiece chamber 206 remaining separated, blocked, and isolated from the air flow within the transfer compartment 212 allows for an environment within the workpiece chamber 206 to be controlled and maintained within selected environmental parameters to reduce the likelihood of the generation of defects, damage, or degradation of the workpieces 202 within the workpiece chamber 206 while the workpieces 202 await to be processed and refined by the tool 213 within the tool compartment 216.

Figure 3:
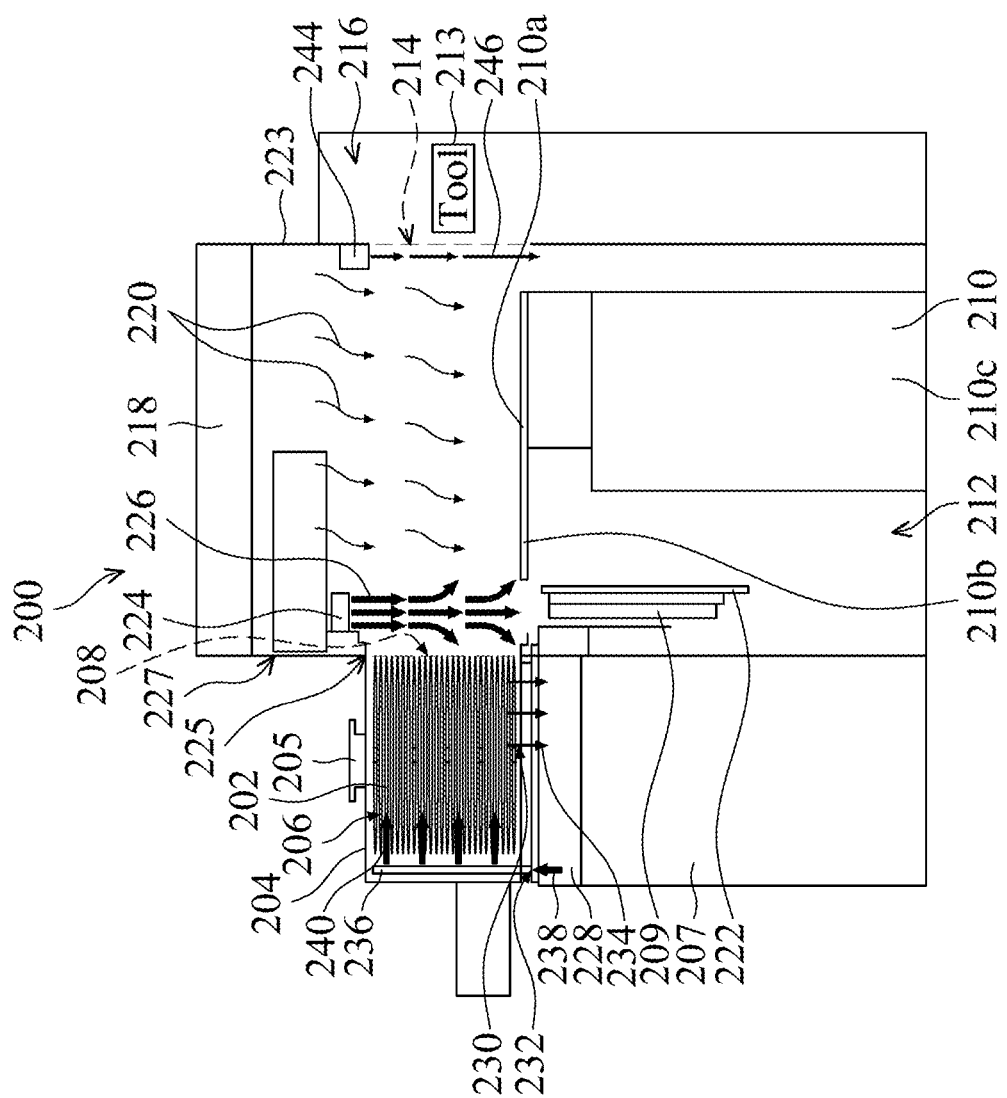
FIG. 3 illustrates a schematic side view of an alternative embodiment of the workpiece processing apparatus as shown in FIGS. 2A and 2B, in accordance with some embodiments of the present disclosure.

FIG. 3 is a schematic side view of an alternative embodiment of the workpiece processing apparatus 200 including a second air curtain device 244 that is adjacent to an upper end of the opening 214 that provides the transfer blade 210b of the robot 210 access to the tool compartment 216 of the workpiece processing apparatus 200. The second air curtain device 244 forms a second air curtain 246 represented by arrows 246, and these arrows 246 together may be referred to as the second air curtain 246. Similar to the first air curtain 226, the second air curtain 246 separates and isolates air within the tool compartment 216 from the air flow 220 within the transfer compartment 212. In other words, the second air curtain 246 acts as a boundary or a wall of air that blocks, stops, or prevents the air flowing downwards through the transfer compartment 212 from entering the tool compartment 216 through the opening 214. The second air curtain 246 may completely and entirely overlap and cover the opening 214 to completely separate and isolate the air within the tool compartment 216 from the air flowing (e.g., arrows 220) within the transfer compartment 212. This separation of the air in the tool compartment 216 from that of the transfer compartment 212 reduces the likelihood of contaminants or debris entering the tool compartment 216 from the transfer compartment 212. This reduction of likelihood of contaminants or debris entering the tool compartment 216 through the opening 214 reduces the likelihood of damaging the tool 213 or the generation of defects, damage, or degradation of a workpiece or workpieces 202 present within the tool compartment 216 being processed or refined by the tool 213.

As will become readily apparent with respect to the discussion of FIGS. 6A and 6B later herein within this present disclosure, additional air curtain devices may be provided within the workpiece processing apparatus 200 to separate and isolate the transfer compartment 212 from other areas within the workpiece processing apparatus 200 to reduce the likelihood of the generation of defects, damage, or degradation of the workpieces 202 when moving through the workpiece processing apparatus 200.

Figure 4:
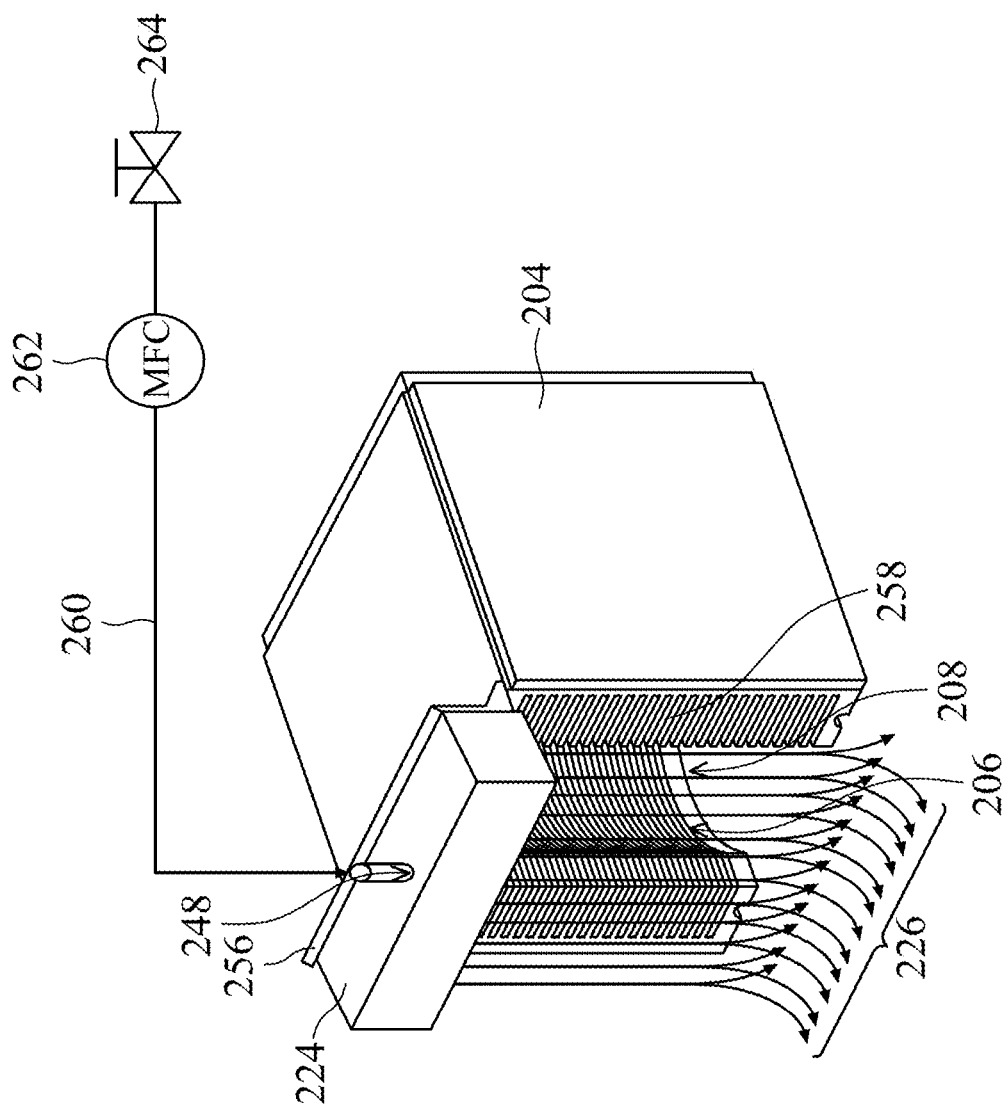
FIG. 4 illustrates an example of an air curtain device in use with a container, in accordance with some embodiments of the present disclosure.
Figure 4:
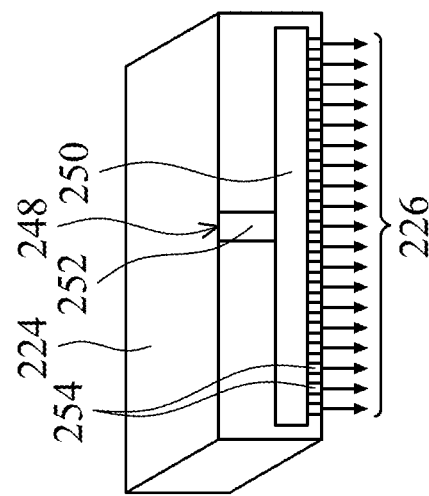

FIG. 4 includes a left-hand side image and a right-hand side image. The left-hand image is a perspective view of the first air curtain device 224, and the right-hand image is a perspective view of the first air curtain device 224 over the upper end of the container 204 as shown in FIGS. 2B and 3 as discussed earlier herein.

As shown in the right-hand side image of FIG. 4, the first air curtain device 224 includes an inlet 248, a chamber 250 in fluid communication with the inlet 248 through a fluid inlet pathway 252, and a plurality of nozzles or outlets 254 that are in fluid communication with the chamber 250. The plurality of nozzles 254 extend along the chamber 250 such that the first air curtain device 224 may form the first air curtain 226 in an evenly distributed manner.

As shown in the left-hand side image of FIG. 4, the first air curtain device 224 is mounted to the sidewall 227 of the workpiece processing apparatus 200 by a mounting bracket 256. The sidewall 227 is not visible for visibility purposes of the mounting bracket 256 relative to the container 204.

The first air curtain device 224 is coupled to the mounting bracket and may be held in a stationary position on the sidewall 227 of the workpiece processing apparatus 200 such that the first air curtain 226 completely and entirely covers and overlaps the opening 208 of the container 204. The first air curtain 226 completely and entirely covering and overlapping the opening 208 separates the air flowing downward through the transfer compartment 212 from the air within the workpiece chamber 206. The container 204 includes a plurality of shelfs 258 that are within the workpiece chamber 206 and line sidewalls of the container 204 that delimit the workpiece chamber 206. Each shelf of the plurality of shelfs 258 is configured to receive a corresponding one of the workpieces 202, which may be wafers, that are in the stacked configuration as shown in FIGS. 2B and 3 as discussed earlier herein.

The inlet 248 is in fluid communication with a fluid pathway 260. A mass flow controller (MFC) 262 is along the fluid pathway 260 and a valve 264 is coupled to an end of the fluid pathway 260. The MFC 262 is between the inlet 248 of the first air curtain device 224 and the valve 264. While not shown, the valve 264 may be coupled to a clean dry air (CDA) source (not shown) through another fluid pathway such that the CDA may readily pass through the valve 264 when open. As the CDA passes through the open valve 264, the MFC 262 may control a speed of the CDA flowing through the fluid pathway 260 into the inlet 248 to form the first air curtain 226 utilizing the first air curtain device 224. In other words, the CDA passes successively through the valve 264, the MFC 262, the inlet 248, the fluid inlet pathway 252, the chamber 250, and the plurality of nozzles 254 to form the first air curtain 226. While only the features of the first air curtain device 224 are described herein, it will be readily appreciated that the other air curtain devices (e.g., the second, third, and fourth air curtain devices 244, 276, 278) have the same or similar features as the first air curtain device 224 to form their respective air curtains.

The first air curtain device 224 may have a width of 320-330 mm (millimeters), a length of 40-50 mm, and a height of 40-50 mm based on the orientation as shown in FIG. 4. However, in some embodiments in accordance with the present disclosure, the first air curtain device 224 may have a width, a length, and a height different than those as set forth directly above depending on the situation in which the first air curtain device 224 is to be utilized.

The first air curtain 226 output by the first air curtain device 224 may have a fluid flow rate of 200-500 L/min (liters per minute). However, in some embodiments in accordance with the present disclosure, the fluid flow rate of the first air curtain 226 may be different than that set forth directly above depending on the situation in which the first air curtain 226 is being output by the first air curtain device 224.

Figure 5:
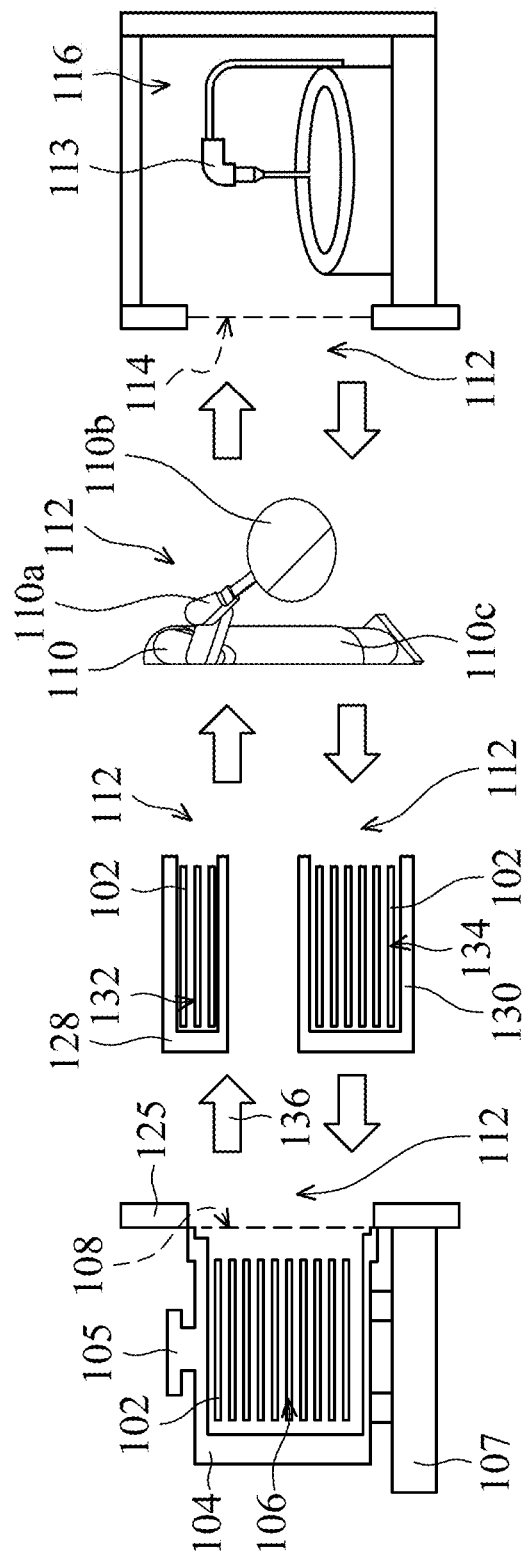
FIG. 5 illustrates a schematic diagram of examples of locations within the example of the workpiece processing apparatus as shown in FIG. 1A.

FIG. 5 is a schematic view of an alternative embodiment of the workpiece processing apparatus 100 as shown in FIG. 1A. The workpiece processing apparatus 100 as shown in FIG. 5 further includes a transfer buffer container 128 and an idle buffer container 130.

The robot 110 may transfer or transport ones of the workpieces 102 and place them within the transfer buffer container 128 for storage while the workpieces 102 within the transfer buffer container 128 await to be processed by the tool 113 in the tool compartment 116. For example, the transfer blade 110b may pick up one of the workpieces 102 within the container 104 and transfer that respective workpiece 102 to the transfer buffer container 128. The respective workpiece 102 may then be placed within the transfer buffer container 128 for storage while awaiting to be received by the tool compartment 116.

The robot 110 may transfer or transport ones of the workpieces 102 after being processed or refined by the tool 113 in the tool compartment 116 for storage in the idle buffer container 130 before being transferred to the workpiece chamber 106 within the container 104. For example, the transfer blade 110b may transfer the respective workpieces 102 from the tool compartment 116 after being processed or refined by the tool 113, and place the respective workpieces 102 within the idle buffer container 130 for storage. The transfer blade 110b may then later transfer the respective workpieces 102 within the idle buffer container 130 by picking up the respective workpieces 102 and transferring the respective workpieces 102 to the workpiece chamber 106 of the container 104.

The transfer buffer container 128 may be integral and part of the workpiece processing apparatus 100 itself unlike the container 104 (e.g., a foup) that may be readily removed from the workpiece processing apparatus 100. The idle buffer container 130 may be integral and part of the workpiece processing apparatus 100 itself unlike the container 104 (e.g., a foup) that may be readily removed from the workpiece processing apparatus 100 by the carrier and track system (not shown).

The arrows 136 as shown in FIG. 5 illustrate how the workpieces 102 may readily move through the workpiece processing apparatus 100. For example, the workpieces 102 may be transferred by the transfer robot 110 through the transfer compartment 112 to different areas within the workpiece processing apparatus 100. As shown in FIG. 5, one or more of the workpieces 102 are successively moved by the robot 110 from the container 104 to the transfer buffer container 128, from the transfer buffer container 128 to the tool compartment 116, from the tool compartment 116 to the idle buffer container 130, and from the idle buffer container 130 to the container 104.

Similar to the workpiece chamber 106, respective storage chambers 132, 134 of the transfer buffer container 128 and the idle buffer container 130, respectively, are in direct fluid communication with the transfer compartment 112 such that air flowing downwards through the transfer compartment 112 may enter the respective storage chambers 132, 134. The workpieces 102 stored within the respective storage chambers 132, 134 may be exposed to the air flowing (e.g., arrows 120) through the transfer compartment 112 and result in the generation of defects, damage, or degradation of the workpieces 102 due to being exposed to the air flowing (e.g., arrows 120) through the transfer compartment 112 in the same or similar fashion as discussed above with respect to FIGS. 1A and 1B. Accordingly, this discussion of the generation of defects, damage, or degradation of the workpieces 102 within the respective storage chambers 132, 134 is not discussed in further detail herein for brevity and simplicity sake of the present disclosure.

Figure 6A:
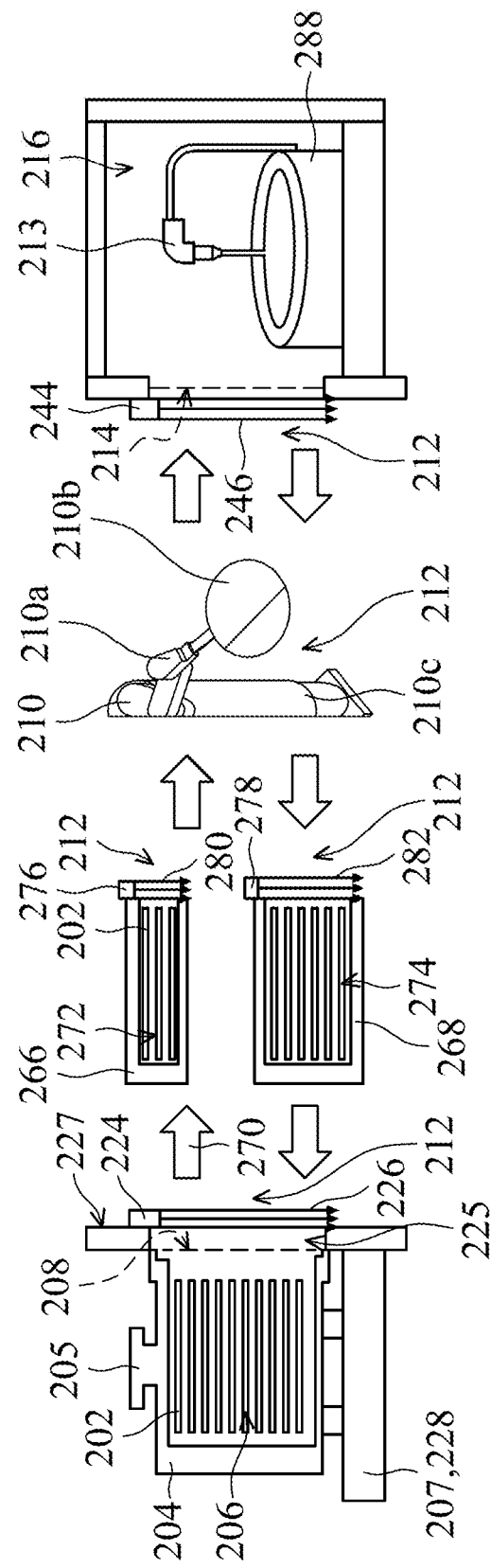
FIG. 6A illustrates an example of a schematic diagram of locations within a workpiece processing apparatus with one or more air curtain devices, in accordance with some embodiments of the present disclosure.

FIG. 6A is a schematic view of an alternative embodiment of the workpiece processing apparatus 200 as shown in FIG. 3. The workpiece processing apparatus 200 as shown in FIG. 6A further includes a transfer buffer container 266 and an idle buffer container 268.

The robot 210 may transfer ones of the workpieces 202 and place them within the transfer buffer container 266 for storage while the workpieces 202 await to be processed by the tool 213 in the tool compartment 216. For example, the transfer blade 210b may pick up one of the workpieces 202 within the container 204 and transfer that respective workpiece 202 to the transfer buffer container 266. The respective workpiece 202 may then be placed within the transfer buffer container 266 for storage while awaiting to be received by the tool compartment 216.

The robot 210 may transfer or transport ones of the workpieces 202 after being processed or refined by the tool 213 in the tool compartment 216 for storage in the idle buffer container 268 before being transferred to the workpiece chamber 206 within the container 204. For example, the transfer blade 210b may transfer the respective workpieces 202 from the tool compartment 216 after being processed or refined by the tool 213 and place the respective workpieces 202 within the idle buffer container 268 for storage. The transfer blade 210b may then later transfer or transport the respective workpieces 202 from within the idle buffer container 268 by picking up the respective workpieces 202 and transferring the respective workpieces 202 back to being stored within the workpiece chamber 206 of the container 204.

The transfer buffer container 266 may be integral and part of the workpiece processing apparatus 200 itself unlike the container 204 (e.g., a foup) that may be readily removed from the workpiece processing apparatus 200. The idle buffer container 268 may be integral and part of the workpiece processing apparatus 200 itself unlike the container 204 (e.g., a foup) that may be readily removed from the workpiece processing apparatus 200. When the transfer and idle buffer containers 266, 268 are integral to the workpiece processing apparatus 200, mounting brackets (not shown) similar to the mounting bracket 256 as shown in FIG. 4 may be coupled directly to the transfer and idle buffer containers 266, 268 such that the respective mounting brackets (not shown) are fixedly coupled to the transfer and idle buffer containers 266, 268, respectively. For example, in some embodiments in accordance with the present disclosure, the transfer and idle buffer containers 266, 268 may be within the housing 223 and directly adjacent to the transfer compartment 212 such that transfer blade 210b of the robot 210 may readily access and be inserted into the respective storage compartments 272, 274 of the transfer and idle buffer containers 266, 268.

Alternatively, in some embodiments in accordance with the present disclosure, the transfer and idle buffer containers 266, 268 may be the same or similar to the container 204 in that the transfer and idle buffer containers 266, 268 may be removed and separable from the workpiece processing apparatus 200. In other words, the transfer and idle buffer containers 266, 268 are not integral to the workpiece processing apparatus 200 in some embodiments in accordance with the present disclosure. For example, the transfer and idle buffer containers 266, 268 may be foups the same or similar to the container 204, which also may be a foup. In the embodiments in which the transfer and idle buffer containers 266, 268 are foups, additional openings similar to the load port opening 225 may be provided such that the workpieces 202 within the transfer and idle buffer containers 266, 268 may be transferred into the transfer compartment 212 by the robot 210. In the embodiments in which the transfer and idle buffer containers 266, 268 are foups, additional opening and closing interface mechanisms the same or similar to the opening and closing interface mechanism 222 may be provided to open and close the additional openings the same or similar to how the opening and closing interface mechanism 222 opens and closes the load port opening 225 as discussed earlier herein.

The arrows 270 as shown in FIG. 6A illustrate how the workpieces 202 may readily move through the workpiece processing apparatus 200. For example, the workpieces 202 may be transferred by the transfer robot 210 through the transfer compartment 212 to different areas within the workpiece processing apparatus 200. As shown in FIG. 6A, one or more of the workpieces 202 are successively moved by the robot 210 from the container 204 to the transfer buffer container 266, from the transfer buffer container 266 to the tool compartment 216, from the tool compartment 216 to the idle buffer container 268, and from the idle buffer container 268 to the container 204.

The transfer buffer container 266 and the idle buffer container 268 include respective storage chambers 272, 274 therein. The workpieces 202 are stored within the respective storage chambers 272, 274 while awaiting to be transferred by the robot 210.

However, unlike the workpiece processing apparatus 100 as shown in FIG. 5, the workpiece processing apparatus 200 as shown in FIG. 6A includes a third air curtain device 276 and a fourth air curtain device 278. The third air curtain device 276 forms a third air curtain 280, and the fourth air curtain device 278 forms a fourth air curtain 282. The third air curtain 280 separates and isolates the storage chamber 272 of the transfer buffer container 266 from the downwards air flow within the transfer compartment 212. The fourth air curtain 282 separates and isolates the storage chamber 274 of the idle buffer container 268 from the downwards air flow within the transfer compartment 212. In other words, the third air curtain 280 completely and entirely overlaps an opening of the transfer buffer container 266 that provides access to the storage chamber 272 of the transfer buffer container 266, and the fourth air curtain 282 completely and entirely overlaps an opening of the idle buffer container 268 that provides access to the storage chamber 274 of the idle buffer container 268.

The third and fourth air curtains 280, 282 formed by the third and fourth air curtain devices 276, 278 separate and isolate the respective workpieces 202 stored within the storage chambers 272, 274 within the transfer and idle buffer containers 266, 268, respectively, from the downwards air flow within the transfer compartment 212. This reduces the likelihood of the generation of defects, damages, or degradation of the workpieces 202 present within the storage chambers 272, 274 of the transfer and idle buffer containers 266, 268, respectively. The details of the generation of defects, damage, and degradation of the workpieces 202 should be readily apparent in view of the earlier discussions herein. Accordingly, the discussion of the generation of defects, damage and degradation of the workpieces 202 will not be reproduced here for brevity and simplicity of the present disclosure.

The third air curtain device 276 may be directly coupled to a front end of the transfer buffer container 266 by a mounting bracket similar to the mounting bracket 256 as shown in FIG. 4. In some embodiments, the mounting bracket may instead be coupled to a sidewall of the workpiece processing apparatus 200 instead.

The fourth air curtain device 278 may be directly coupled to a front end of the idle buffer container 268 by a mounting bracket similar to the mounting bracket 256 as shown in FIG. 4. In some embodiments, the mounting bracket may instead be coupled to a sidewall of the workpiece processing apparatus 200 instead.

Similar to the first air curtain 226 that may be laminar, the second, third, and fourth air curtains 246, 280, 282 may be laminar as well. For example, the second, third, and fourth air curtains 246, 280, 282 may have a fluid flow with a Reynolds number less than or equal to about 2,000 such that the second, third, and fourth air curtains 246, 280, 282 are laminar and are not turbulent such that the respective storage chambers 272, 274 and the tool compartment 216 are separated and isolated from the transfer compartment 212 in a controlled manner. This laminar fluid flow of the second, third, and fourth air curtains 246, 280, 282 may reduce the likelihood of the generation of defects, damages, or degradation of the workpieces 202 within the respective storage chambers 272, 274 and the tool compartment 216.

When the tool 213 is a wet clean tool or some similar or like type of wet tool that performs a wet process, controlling environmental quantities and qualities (e.g., relative humidity) within the workpiece chamber 206, the respective storage chambers 272, 274, the transfer compartment 212, and the tool compartment 216 may be even more challenging relative to when the tool 213 is not a wet clean tool or some other similar or like type of wet tool. However, while this may be more challenging, providing the first, second, third, and fourth air curtain devices 224, 244, 276, 278 that form the first, second, third, and fourth air curtains 226, 246, 280, 282 at the selected locations allows for the environment quantities and qualities within these respective chambers and compartments to remain separated and isolated from the transfer compartment 212 and each other. In view of this discussion, the first, second, third, and fourth air curtain devices 224, 244, 276, 278 reduce the likelihood of the generation of defects, damages, or degradation of the workpieces 202 within the various respective chambers and compartments in which the workpieces 202 are present.

The second, third, and fourth air curtain devices 244, 276, 278 may have the same width, length, and height of the first air curtain device 224 as discussed with respect to FIG. 4. However, in some embodiments in accordance with the present disclosure, the second, third, and fourth air curtain devices 244, 276, 278 may have a width, a length, and a height different than those as set forth above with respect to the first air curtain device 224 in the discussion of FIG. 4 depending on the situation in which the second, third, and fourth air curtain devices 244, 276, 278 are utilized.

The second, third, and fourth air curtains 246, 280, 282 output by the second, third, and fourth air curtain devices 244, 276, 278, respectively, may have a fluid flow rate the same or similar to the fluid flow rate of the first air curtain 226 as discussed earlier herein with respect to FIG. 4. However, in some embodiments in accordance with the present disclosure, the fluid flow rate of the second, third, and fourth air curtains 246, 280, 282 may be different than that set forth above with respect to the first air curtain 226 in the discussion of FIG. 4 depending on the situation in which the second, third, and fourth air curtains 246, 280, 282 are being output by the second, third, and fourth air curtain devices 244, 276, 278, respectively.

Figure 6B:
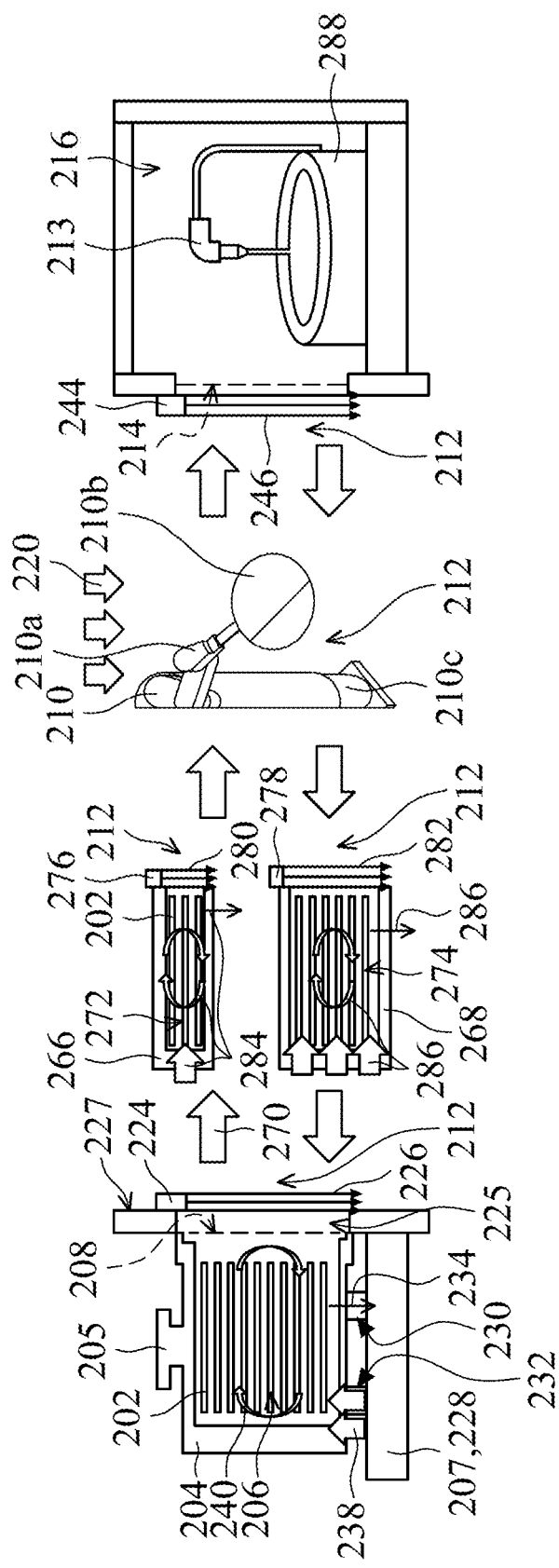
FIG. 6B illustrates an example of a schematic diagram of locations within a workpiece processing apparatus with one or more air curtain devices, in accordance with some embodiments of the present disclosure.

FIG. 6B illustrates an alternative embodiment of the workpiece processing apparatus 200 that is similar to the alternative embodiment of the workpiece processing apparatus 200 as shown in FIG. 6A. However, unlike the alternative embodiment of the workpiece processing apparatus 200 as shown in FIG. 6A, the alternative embodiment of the workpiece processing apparatus 200 as shown in FIG. 6B further includes clean dry air (CDA) that is circulated through the container 204, the transfer buffer container 266, and the idle buffer container 268. In the alternative embodiment as shown in FIG. 6B, the CDA may be circulated through the container 204 in the same or similar manner as shown and discussed earlier herein with respect to FIG. 3.

In view of the circulation of the CDA through the container 204 as discussed with respect to FIG. 3 and as also shown in FIG. 6B, CDA may also be circulated through the transfer and idle buffer containers 266, 268 in the same or similar fashion as CDA is circulated through the container 204. The circulation of CDA through the transfer buffer container 266 is represented by arrows 284, and the circulation of CDA through the idle buffer container 268 is represented by arrows 286. As the circulation of CDA through the transfer and idle buffer containers 266, 268, respectively, is the same or similar to the circulation of CDA through the container 204 as discussed above with respect to FIG. 3, further discussion of details of the circulation of CDA through the respective storage chambers 272, 274 of the transfer and idle buffer containers 266, 268 will be not be discussed herein for simplicity and brevity of the present disclosure. The CDA may be circulated through the workpiece chamber 206 utilizing the air purge device 228 at the load port structure 207 as discussed above with respect to FIG. 3.

The CDA may be circulated through the respective storage chambers 272, 274 of the transfer and idle buffer containers 266, 268, respectively, by respective air purge devices in fluid communication with the respective storage chambers 272, 274. For example, these respective air purge devices in fluid communication with the respective storage chambers 272, 274, which circulate CDA through these respective storage chambers 272, 274, may be the same or similar to the functional and structural features of the air purge device 228 at the load port structure 207 as discussed with respect to FIG. 3.

While not shown, alternative embodiments of the workpiece processing apparatus 200 may include additional CDA systems that are provided to be utilized in circulating CDA through the tool compartment 216 and the transfer compartment 212 to further reduce the likelihood of the generation of defects, damage, or degradation as the workpieces 202 pass through the various locations and areas (e.g., the workpiece chamber 206 of the container 204, the storage chamber 272 of the transfer buffer container 266, the transfer compartment 212 containing the robot 210, the tool compartment 216 containing the tool 213, and the storage chamber 274 of the idle buffer container 268) of the workpiece processing apparatus 200. These CDA systems circulating air through the transfer compartment 212 and the tool compartment 216, respectively, may be the same or similar to the functional and structural features of the air purge device 228 at the load port structure 207 as discussed with respect to FIG. 3.

In some embodiments, the CDA or air circulating through the container 204, the transfer buffer container 266, and the idle buffer container 268 may have different properties than the CDA or air circulating through the transfer compartment 212. For example, the CDA or air circulating through the container 204, the transfer buffer container 266, and the idle buffer container 268 may have a first relative humidity that is less than a second relative humidity of the CDA or air circulating through the transfer compartment 212. For example, the first relative humidity may be about 10% and the second relative humidity may be about 40%.

When the first, second, third, and fourth air curtain devices 224, 244, 276, 278 are present and are utilized in combination with the systems to circulate CDA through the environments of the respective chambers and compartments (e.g., workpiece chamber 206, storage chambers 272, 274, and tool compartment 216, the environmental quantities or qualities (e.g., relative humidity) within the respective chambers and compartments may be further controlled to reduce the likelihood of the generation of defects, damages, or degradation of the workpieces 202 within the respective chambers and compartments.

As shown in FIG. 6A, the container 104 is larger than the transfer buffer container 266 and the idle buffer container 268, and the idle buffer container 268 is larger than the transfer buffer container 266. However, in some embodiments, the respective containers 104, 266, 268 may be sized and shaped differently such that the container 104 may be smaller or more similar in size and shape to the transfer and idle buffer containers 266, 268 and vice versa.

While not shown in FIGS. 6A and 6B, the transfer and idle buffer containers 266, 268 include respective shelves each configured to receive a corresponding one of the workpieces 202. For example, the respective shelves in the transfer and idle buffer containers 266, 268 are the same or similar to the plurality of shelves 258 within the container 204.

By controlling environmental quantities and qualities (e.g., humidity, CDA, etc.) within the workpiece chamber 206 of the container 204, the tool compartment 216, and the respective storage chambers 272, 274 within the transfer and idle buffer containers 266, 268, respectively, the queue time (Q time) may be increased that allows for flexibility in manufacturing semiconductor products or devices utilizing the FAB and reducing costs by reducing the number of respective workpieces 202 that become scrap. The Q time, may be the time for which a respective workpiece 202 is stored before being processed by the tool 213 and transported away from the workpiece processing apparatus 200.

In view of the above discussion herein, by utilizing the respective air curtain devices, fewer of the workpieces 202 become scrap by controlling the environmental quantities and qualities within the workpiece chamber 206, the tool compartment 216, and the respective storage chambers 272, 274 in which the workpieces 202 are stored while being processed and refined by the workpiece processing apparatus 200. For example, while these workpieces 202 are being stored, the Q time may be increased as the likelihood of the generation of defects, damages, or degradation of the workpieces 202 is decreased even if the workpieces are stored for a longer Q time. This allows the tolerances for the Q time to be loosened (e.g., as the Q time may be made longer) as there is less likelihood of the generation of defects, damages, or degradation of the workpieces 202 even when the workpieces are stored within the workpiece processing apparatus 200 for longer Q times.

In view of the above discussion herein, by utilizing the respective air curtain devices, fewer of the workpieces become scrap by controlling the environmental quantities and qualities within the workpiece chamber 206, the tool compartment 216, and the respective storage chambers 272, 274 in which the workpieces are stored while being processed and refined by the workpiece processing apparatus 200. For example, the likelihood of the generation of defects, damages, or degradation of the workpieces is reduced as the workpieces 202 are exposed to less moisture or humidity than present in the transfer compartment 212 as discussed herein.

Figure 7:
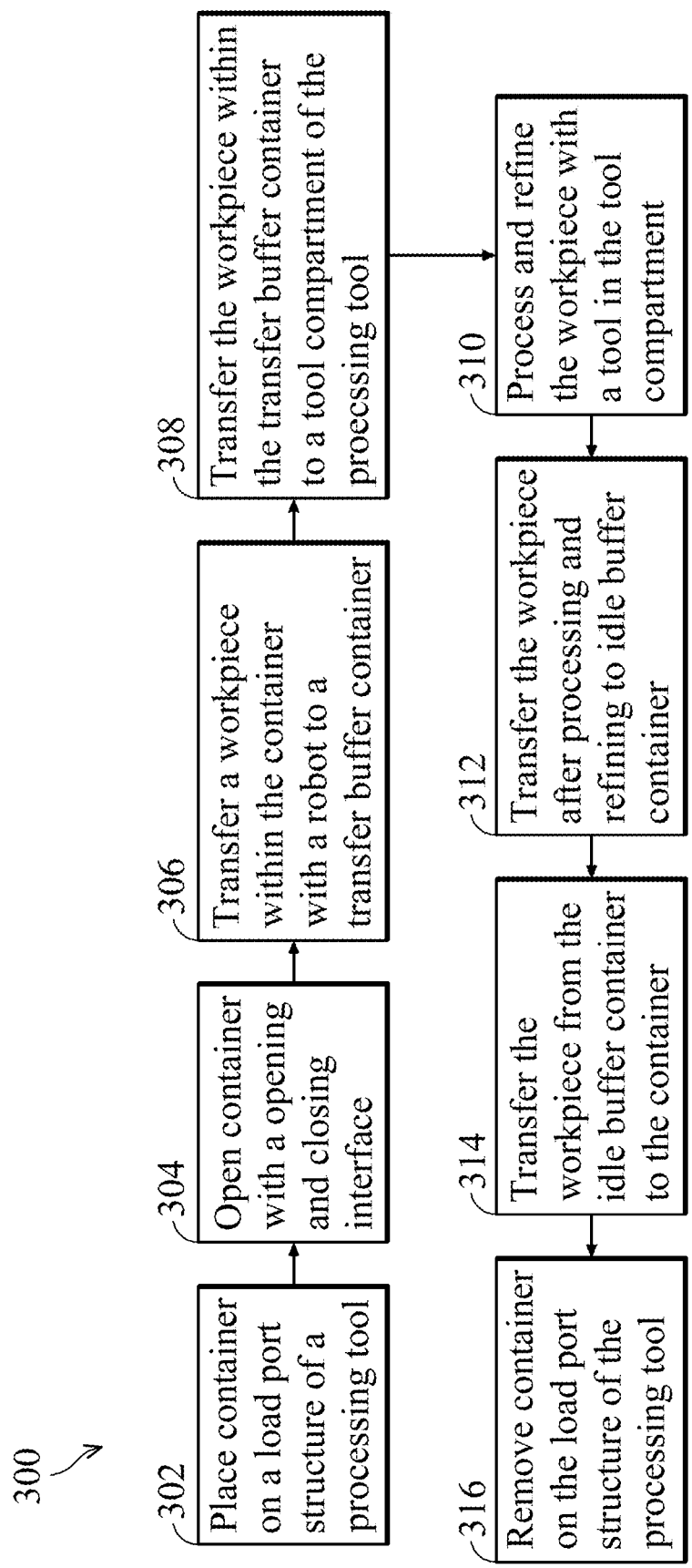
FIG. 7 illustrates a flow chart of a method of transferring a workpiece within embodiments of a workpiece processing apparatus, in accordance with some embodiments of the present disclosure.

FIG. 7 illustrates a flow chart diagram of an embodiment of a method 300 of transferring the workpieces 202 through the embodiments of the workpiece processing tools, devices, or apparatuses 200 as discussed herein. It will be readily appreciated that steps of the method 300 may be reorganized or carried out in a different order depending on when and how the workpieces 202 are to be processed or refined by the embodiments of the workpiece processing apparatuses as discussed herein.

In a first step 302, the track and carrier system (not shown) as discussed herein carries the container 204 to the workpiece processing apparatus 200. The track and carrier system positions the container 204 on the load port structure 207 and mechanically disengages with the lift structure 205 of the container 204. The track and carrier system positions the container 204 on the load port structure 207 such that the fluid distribution structure 236 is in fluid communication with the air purge device 228 to distribute CDA within the workpiece chamber 206 of the container 204, and the inlet 230 of the purge air device 228 is in fluid communication with the workpiece chamber 206 to circulate the CDA through the workpiece chamber 206.

In a second step 304, after the container 204 is at and on the load port structure 207 such that the air purge device 228 is in fluid communication with the workpiece chamber 206 within the container 204. The lid 209 is removed from the container 204 by the opening and closing interface mechanism 222 such that the opening 208 is uncovered and the transfer blade 210b of the robot 210 may readily access the workpieces 202 within the workpiece chamber 206 through the opening 208.

Either before, after, or simultaneously as the container 204 is placed on the load port structure 207, the first air curtain device 224 is turned on to form the first air curtain 226 to separate the CDA within the workpiece chamber 206 from the downwards air flow in the transfer compartment 212. In other embodiments of the method 300, all of the respective air curtain devices 224, 244, 276, 278 may remain continuously on when the workpiece processing apparatus 200 is being utilized within the semiconductor fabrication plant (FAB) to manufacture semiconductor products or devices.

In a third step 306, after the lid 209 is removed from the container 204, the transfer blade 210b of the robot 210 passes through the opening 208 into the workpiece chamber 206 and picks up at least one of the workpieces 202. The transfer blade 210b supports the workpiece 202 and transports the workpiece 202 to the transfer buffer container 266. The transfer blade 210b then positions the workpiece 202 within the transfer buffer container 266 for storage within the storage chamber 272 of the transfer buffer container 266.

In one embodiment of the method 300, the first air curtain device 224 and the third air curtain device 276 may remain on such that the transfer blade 210b and the workpiece 202 pass through the first air curtain 226 and the third air curtain 280. Alternatively, in some embodiments of the method 300, the first air curtain device 224 is turned off slightly before the transfer blade 210b enters the workpiece chamber 206 through the opening 208 and the first air curtain device 224 is turned on slightly after the transfer blade 210b exits the workpiece chamber 206 through the opening 208 such that the transfer blade 210b and the workpiece 202 do not pass through the first air curtain 226. In some embodiments of the method 300, the third air curtain device 276 is turned off slightly before the transfer blade 210b enters the storage chamber 272 of the transfer buffer container 266 and the third air curtain device 276 is turned on slightly after the transfer blade 210b exits the storage chamber 272 of the transfer buffer container 266 such that the transfer blade 210b and the workpiece 202 do not pass through the third air curtain 280.

In a fourth step 308, the robot 210 transfers the workpiece 202 from the storage chamber 272 in the transfer buffer container 266 to the tool compartment 216 to be processed or refined by the tool 213. The transfer blade 210b may pass through the third air curtain 280 to enter the storage chamber 272 to pick up and support the workpiece 202 to transport the workpiece 202 from the storage chamber 272 of the transfer buffer container 266 to the tool compartment 216. The transfer blade 210b may pass through the second air curtain 246 to enter the tool compartment 216 to position the workpiece 202 within the tool compartment 216. Alternatively, in some embodiments, the third air curtain device 276 may be turned off slightly before the transfer blade 210b enters the storage chamber 272 of the transfer buffer container 266, and may be turned on slightly after the transfer blade 210b exits the storage chamber 272 of the transfer buffer container 266 such that the transfer blade 210b and the workpiece 202 do not pass through the third air curtain 280. In some embodiments, the second air curtain device 244 may be turned off slightly before the transfer blade 210b enters the tool compartment 216, and may be turned on slightly after the transfer blade 210b exits the tool compartment 216 such that the transfer blade 210b and the workpiece 202 do not pass through the second air curtain 246.

In a fifth step 310, after the workpiece 202 is positioned within the tool compartment 216, the tool 213 refines or processes the workpiece 202 positioned within the tool compartment 216. Before refining or processing the workpiece 202, the workpiece may be positioned on a support 288 as shown in FIGS. 6A and 6B. After the workpiece 202 is positioned on the support 288, the tool 213 is turned on to refine or process the workpiece 202. Alternatively, in some embodiments, the support 288 may not be present, and instead, the workpiece 202 may be present on the transfer blade 210b when the tool 213 is turned on to refine or process the workpiece 202.

In a sixth step 312, the transfer blade 210b enters the tool compartment 216 and picks up the workpiece 202 to transport the workpiece 202, which has been processed or refined by the tool 213, from the tool compartment 216 to the storage chamber 274 of the idle buffer container 268. The transfer blade 210b and the workpiece 202 may readily pass through the second air curtain 246. Alternatively, the second air curtain device 244 may be turned off slightly before the transfer blade 210b enters the tool compartment 216 through the opening 214, and may be turned on slightly after the transfer blade 210b exits the tool compartment 216 through the opening 214 such that the transfer blade 210b and the workpiece 202 do not pass through the second air curtain 246.

The transfer blade 210b then supports the workpiece 202 to transfer the workpiece 202 to the storage chamber 274 of the idle buffer container 268. The transfer blade 210b and the workpiece 202 supported by the transfer blade 210b may readily pass through the fourth air curtain 282. Alternatively, the fourth air curtain device 278 may be turned off slightly before the transfer blade 210b enters the storage chamber 274 of the idle buffer container 268, and may be turned on slightly after the transfer blade 210b exits the storage chamber 274 of the idle buffer container 268 such that the transfer blade 210b and the workpiece 202 do not pass through the fourth air curtain 282.

In a seventh step 314, the workpiece 202 is transferred from the storage chamber 274 of the idle buffer container 268 to the workpiece chamber 206 within the container 204 by the transfer blade 210b of the robot 210. The transfer blade 210b passes through the fourth air curtain 282 and picks up the workpiece 202. Once the transfer blade 210b picks up the workpiece 202, the transfer blade 210b and the workpiece 202 exit the storage chamber 274 and pass through the fourth air curtain 282. After passing through the fourth air curtain 282, the transfer blade 210b and the workpiece 202, which is supported by the transfer blade 210b, is transferred to the workpiece chamber 206 by passing through the first air curtain 226. The transfer blade 210b then positions the workpiece 202 within the workpiece chamber 206 on a respective shelf 258 of the plurality of shelfs 258. The transfer blade 210b exits the workpiece chamber 206 after positioning the workpiece 202, which has been refined and processed by the tool 213, in the workpiece chamber 206.

Alternatively, in some embodiments of the method 300, the fourth air curtain device 278 may be turned off slightly before the transfer blade 210b enters the storage chamber 274 of the idle buffer container 268, and may be turned on slightly after the transfer blade 210b exits the storage chamber 274 of the idle buffer container 268 such that the transfer blade 210b and the workpiece 202 do not pass through the fourth air curtain 282. In some embodiments of the method 300, the first air curtain device 224 may be turned off slightly before the transfer blade 210b enters the workpiece chamber 206 through the opening 208, and the first air curtain device 224 may be turned on slightly after the transfer blade 210b exits the workpiece chamber 206 through the opening 208 such that the transfer blade 210b and the workpiece 202 do not pass through the first air curtain 226.

In an eighth step 316, the track and carrier system (not shown) as discussed herein may remove the container 204 from the load port structure by mechanically engaging with the lift structure 205 of the container 204 and lifting up on the container 204. Before the track and carrier system removes the container 204 from the load port structure 207, the opening and closing interface mechanism 222 moves from the opened position to the closed position to close off the opening 225 in the sidewall 227 of the workpiece processing apparatus 200, and couples the lid 209 to the container 204 as well. Coupling the lid 209 to the container 204 closes the opening 208 and covers the workpiece chamber 206 containing the workpieces 202 to protect the workpieces 202 when transferring them in the container 204 with the track and carrier system (not shown) to another location within the semiconductor fabrication plant (FAB). After the container 204 is removed from the load port structure 207, the first air curtain device 224 may be turned off to conserve energy.

When the workpiece processing apparatus 200 is not in use, the respective air curtain devices 224, 276, 278, 244 may be turned off to conserve energy. For example, the workpiece processing apparatus 200 may not be in use when the semiconductor fabrication plant (FAB) is fully or partially shut down.

The air and the clean dry air (CDA) as discussed herein may be referred to as a fluid, a gas, or some other similar or like type of reference to the air and the CDA as discussed herein. The transfer and idle buffer containers may be referred to as storage areas, buffer zones, storage compartments, or some other similar or like type of reference to the transfer and idle buffer containers.

In view of the above discussion, the respective relative humidity within the workpiece chamber 206 of the container 204, the respective storage compartments 272, 274 of the transfer and idle buffer containers 266, 268, and the tool compartment 216 may be dropped by about 20%. This reduction of about 20% in the relative humidity within these respective chambers and compartments reduces the amount of moisture or humidity that the workpieces 202 are exposed to while being processed and refined by the workpiece processing apparatus 200. This reduction in exposure to moisture and relative humidity reduces the likelihood of outgassing and reduces the likelihood of exposing the workpieces 202 to contaminants (e.g., debris, contaminant particles, etc.). In view of the above discussion, this reduces the likelihood of the generation of defects, damages, or degradation of the workpieces 202 when being processed and refined by the workpieces processing apparatus 200.

While the above discussion focuses on respective air curtain devices in selected locations within the embodiments of the workpiece processing apparatuses as discussed herein, it will be readily appreciated that the respective air curtain devices may be repositioned to reduce the likelihood of defects, damages, or degradation of the workpieces when being stored by reducing the likelihood of exposing the workpieces to contaminants or environmental quantities or qualities (e.g., moisture, humidity, etc.) that may degrade the workpieces.

As is readily apparent in view of the above discussion within the present disclosure, the likelihood of the generation of defects, damages, or degradation (e.g., reduce quality) of the workpieces is reduced. For example, the respective air curtain devices block, separate, and isolate the workpieces from the downwards air flow within the transfer compartment when the workpieces are present within the storage chambers of the transfer and idle buffer containers, the workpiece chamber of the container, and the tool compartment within the embodiments of the workpiece processing apparatuses. These workpieces are not exposed to the downwards air flow within the transfer compartment when present within these above areas, and, thus, the workpieces are exposed to less moisture, humidity, and contaminants reducing the likelihood of the workpieces becoming scrap. This decreased exposure to moisture, humidity, and contaminants reduces the number of workpieces that become scrap, and, thus, improves the yield of usable semiconductor products and devices that are manufactured within the FAB with the workpieces in which the embodiments of the workpiece processing apparatuses may be present.

As is readily apparent in view of the above discussion within the present disclosure, a Queue time (Q time) may be loosened as the workpieces stored within the storage chambers of the transfer and idle buffer containers and the workpiece chamber of the container due to the reduced likelihood of the generation of defects, damages, or degradation of the workpieces. For example, by isolating and separating the workpieces stored within these areas from the downwards air flow in the transfer compartment of the workpiece processing apparatus with the air curtains, the workpieces may be stored for longer Q times due to this reduced likelihood of the generation of defects, damages, or degradation of workpieces. This loosens the tolerances on the Q time such that the Q time may be lengthened providing greater adaptability or adjustability. For example, even when an error or maintenance issue occurs in the semiconductor fabrication plant (FAB) that results in manufacturing delays within the FAB, the likelihood of the generation of defects, damages, or degradation of the workpieces may not increase as a result of the ability to lengthen the Q time.

As is readily apparent in view of the above discussion within the present disclosure, the likelihood of the generation of defects, damages, or degradation of the workpieces may be further reduced by circulating CDA through the respective storage chambers of respective buffer containers, through the workpiece chamber of the container, and through the tool compartment of the workpiece processing apparatus. As is readily apparent in view of the above discussion within the present disclosure, the Q time may be further increased by circulating CDA through the respective storage chambers of respective buffer containers, through the workpiece chamber of the container, and through the tool compartment of the workpiece processing apparatus. For example, the circulation of the CDA through these areas within the workpiece processing apparatus either alone or in combination with the air curtain devices reduces the likelihood of the generation of defects, damages, or degradation of the workpieces as the workpieces may be exposed to less moisture, humidity, and contaminants when being processed or refined utilizing the embodiments of the workpiece processing apparatuses.

A workpiece processing device may be summarized as including a transfer compartment; a transfer robot within the transfer compartment, the transfer robot configured to transfer workpieces through the transfer compartment; a load port external to the transfer compartment; a load port opening extending from the load port to the transfer compartment; a first air curtain device adjacent to the load port opening and within the transfer compartment, the first air curtain device is configured to form a first air curtain that entirely overlaps the load port opening; a workpiece buffer container including a storage chamber and an opening accessible from the transfer compartment; and a second air curtain device adjacent to the opening of the workpiece buffer container, the second air curtain device is configured to form a second air curtain that entirely overlaps the opening of the workpiece buffer container.

A workpiece storage system may be summarized as including a workpiece container including an opening, and a workpiece chamber in fluid communication with the opening of the workpiece container; an air curtain device adjacent to the workpiece container, the air curtain device configured to form an air curtain to separate and isolate a first fluid within the workpiece chamber from a second fluid within an external environment outside the workpiece chamber, the air curtain entirely overlaps the opening of the workpiece container; and a fluid purge module in fluid communication with the workpiece chamber of the workpiece container, the fluid purge module configured to receive the first fluid within the workpiece chamber of the workpiece container.

A method may be summarized as including forming a first air curtain with a first air curtain device to entirely overlap an opening between a workpiece chamber at a workpiece processing apparatus and a transfer compartment of the workpiece processing apparatus to separate and isolate a first fluid within the workpiece chamber from a second fluid within the transfer compartment; purging the first fluid within the workpiece chamber with a fluid purge module; and introducing a clean dry air (CDA) into the workpiece chamber with a fluid distribution structure in fluid communication with the fluid purge module circulating the first fluid and the CDA through the workpiece chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A workpiece processing device, comprising:
    a transfer compartment contains a first fluid;
    a transfer robot within the transfer compartment, the transfer robot configured to transfer workpieces through the transfer compartment;
    a load port external to the transfer compartment;
    a load port opening extending from the load port to the transfer compartment;
    a first air curtain device adjacent to the load port opening and within the transfer compartment, the first air curtain device is configured to form a first air curtain that entirely overlaps the load port opening;
    a workpiece buffer container including a storage chamber and an opening accessible from the transfer compartment, the workpiece buffer container contains a second fluid; and
    a second air curtain device adjacent to the opening of the workpiece buffer container, the second air curtain device is configured to form a second air curtain that entirely overlaps the opening of the workpiece buffer container;
    a tool compartment contains a third fluid;
    a tool within the tool compartment;
    a tool compartment opening accessible form the transfer compartment;
    a third air curtain device adjacent to the tool compartment opening, the third air curtain device is configured to form a third air curtain that entirely overlaps the tool compartment opening; and
    a first fluid purging module is in fluid communication with the tool compartment, the first fluid purging module is configured to receive the third fluid within the tool compartment and output a clean dry air into the tool compartment, and
    wherein the second fluid within the workpiece buffer container is isolated and separated from the first fluid within the transfer compartment by the first air curtain formed by the first air curtain device.

2. The workpiece processing device of claim 1, wherein the third fluid external to the transfer compartment and within the tool compartment is isolated from a second fluid within the transfer compartment by the second air curtain formed by the second air curtain device.

3. The workpiece processing device of claim 2, further comprising a second fluid purging module in fluid communication with the second fluid, the second fluid purging module configured to receive the second fluid and output clean dry air (CDA) into the workpiece buffer container.

4. The workpiece processing device of claim 1, further comprising:
    a load port interface mechanism including:
        an opened position in which the load port opening is exposed; and
        a closed position opposite to the opened position in which the load port opening is covered and closed by the load port interface mechanism.

5. The workpiece processing device of claim 4, further comprising:
    a workpiece cassette on the load port, the workpiece cassette including:
        a workpiece opening in fluid communication with the transfer compartment through the load port opening when the load port interface mechanism is in the opened position; and
        a workpiece chamber within the workpiece cassette in fluid communication with the workpiece opening.

6. The workpiece processing device of claim 5, wherein a fourth fluid within the workpiece chamber is separated and isolated from the first fluid within the transfer compartment by the first air curtain formed by the first air curtain device.

7. The workpiece processing device of claim 1, wherein a fluid purging module is in fluid communication with the storage chamber of the workpiece buffer container, the fluid purging module is configured to receive the first fluid within the storage chamber of the workpiece buffer container and output a clean dry air (CDA) into the storage chamber of the workpiece buffer container.

8. A workpiece storage system, comprising:
    a workpiece container including:
        an opening; and
        a workpiece chamber in fluid communication with the opening of the workpiece container;
    an air curtain device adjacent to the workpiece container, the air curtain device configured to form an air curtain to separate and isolate a first fluid within the workpiece chamber from a second fluid within an external environment outside the workpiece chamber, the air curtain entirely overlaps the opening of the workpiece container; and
    a fluid purge module in fluid communication with the workpiece chamber of the workpiece container, the fluid purge module configured to receive the first fluid within the workpiece chamber of the workpiece container, and wherein:
        the fluid purge module is configured to filter contaminants from the workpiece chamber and control a relative humidity within the workpiece chamber, and
        the fluid purge module is configured to adjust a relative humidity of the first fluid within the workpiece chamber to be less than a relative humidity of the second fluid within the external environment.

9. The workpiece storage system of claim 8, further comprising:
    a fluid pathway fluidically coupled to an inlet of the air curtain device, the fluid pathway configured to provide a third fluid to the air curtain device to form the air curtain.

10. The workpiece storage system of claim 9, wherein the air curtain device comprises:
    one or more outlets through which the third fluid passes to form the air curtain; and
    a fluid chamber between the inlet and the one or more outlets, the fluid chamber in fluid communication with the inlet and in fluid communication with the one or more outlets, wherein the third fluid passes successively through the inlet, the fluid chamber, and the plurality of outlets.

11. A method, comprising:
    forming a first air curtain with a first air curtain device to entirely overlap an opening between a workpiece chamber at a workpiece processing apparatus and a transfer compartment of the workpiece processing apparatus to separate and isolate a first fluid within the workpiece chamber from a second fluid within the transfer compartment;

purging the first fluid within the workpiece chamber with a fluid purge module; and introducing a clean dry air (CDA) into the workpiece chamber with a fluid distribution structure in fluid communication with the fluid purge module circulating the first fluid and the CDA through the workpiece chamber.

12. The method of claim 11, wherein purging the first fluid within the workpiece chamber with the fluid purge module comprises removing contaminants from within the workpiece chamber.

13. The method of claim 12, wherein the purging the first fluid within the workpiece chamber and introducing the CDA into the workpiece chamber results in a relative humidity within the workpiece chamber that is less than a relative humidity within the transfer compartment.

14. The method of claim 11, further comprising transferring a cassette containing the workpiece chamber to a load port of the workpiece processing apparatus.

15. The method of claim 14, further comprising removing a lid to expose the workpiece chamber within the cassette, wherein the workpiece chamber is accessible to a transfer robot within the transfer compartment.

16. The workpiece processing device of claim 1, wherein the storage chamber of the workpiece buffer container includes a plurality of shelfs to store a plurality of workpieces.

17. The workpiece processing device of claim 1, wherein the workpiece buffer container is a transfer buffer container, and the transfer buffer container is configured to store one or more workpieces awaiting to be processed by the tool within the tool compartment.

18. The workpiece processing device of claim 17, further comprising:

an idle buffer container including a storage chamber and an opening accessible from the transfer compartment; and a fourth air curtain device adjacent to the opening of the idle buffer container, the fourth air curtain device is configured to form a fourth air curtain that entirely overlaps the opening of the idle buffer container.

19. The workpiece processing device of claim 18, wherein the idle buffer container is configured to store one or more workpieces already processed by the tool within the tool compartment.

20. The storage system of claim 19, wherein the transfer robot is configured to transfer respective workpieces between ones of the load port, the transfer buffer container, the idle buffer container, and the tool compartment through the transfer compartment.

* * * * *